United States Patent [19]
Miyaji et al.

[11] Patent Number: 5,973,557
[45] Date of Patent: Oct. 26, 1999

[54] HIGH EFFICIENCY LINEAR POWER AMPLIFIER OF PLURAL FREQUENCY BANDS AND HIGH EFFICIENCY POWER AMPLIFIER

[75] Inventors: Masayuki Miyaji, Takarazuka; Kaoru Ishida, Shijonawate; Hiroaki Kosugi, Hirakata; Yoichi Morinaga; Hidenobu Kato, both of Yokohama; Takashi Enoki, Yokohama, all of Japan

[73] Assignee: Matsushita Electric Industrial Co., Ltd., Osaka, Japan

[21] Appl. No.: 08/950,859

[22] Filed: Oct. 15, 1997

[30] Foreign Application Priority Data

Oct. 18, 1996 [JP] Japan .................................... 8-275770
Dec. 26, 1996 [JP] Japan .................................... 8-347231

[51] Int. Cl.$^6$ ................................ H03F 1/14; H03F 3/68
[52] U.S. Cl. ........................................ 330/51; 330/124 R
[58] Field of Search ........................ 330/51, 126, 124 R, 330/124 D, 295, 302

[56] References Cited

U.S. PATENT DOCUMENTS

| 4,736,171 | 4/1988 | Minarik . |
| 5,008,631 | 4/1991 | Scherer et al. ............................ 330/51 |
| 5,256,987 | 10/1993 | Kibayashi et al. . |
| 5,541,554 | 7/1996 | Stengel et al. . |
| 5,661,434 | 8/1997 | Brozovich et al. ........................ 330/51 |
| 5,774,017 | 6/1998 | Adar ......................................... 330/51 |

FOREIGN PATENT DOCUMENTS

| 0 247 615 | 12/1987 | European Pat. Off. . |
| 0 500 434 | 8/1992 | European Pat. Off. . |
| 2 721 155 | 12/1995 | France . |

*Primary Examiner*—Robert Pascal
*Assistant Examiner*—Patricia T. Nguyen
*Attorney, Agent, or Firm*—Ratner & Prestia

[57] ABSTRACT

The invention presents a high efficiency linear power amplifier of plural frequency bands reduced in the number of parts and elements, simplified in the circuit construction, and saved in the circuit space, and in FIG. 1, signals entering from a common input terminal 1 in frequency bands A and B are matched in both frequency bands A and B in a wide band matching network 2, amplified in a pre-amplifier 3, put into a common terminal 4a of a switch circuit 4, and the signal in frequency band A is put into a changeover terminal 4b, matched in a matching network 5 and amplified in a post-amplifier 6, and its output is matched in a post-matching network 7 and sent out into an output terminal 8, while, similarly, the signal in frequency band B is put into other changeover terminal 4c of the switch circuit 4, matched in a matching network 9, amplified in a post-amplifier 10, and its output is matched in a post-matching network 11 and is sent out into an output terminal 12.

The invention also presents a power amplifier capable of maintaining a similar high efficiency characteristic if the output power is lowered from the output power of maximum efficiency, and in FIG. 10, first and second power amplifiers 113, 114 are disposed in parallel, and a necessary number of power amplifiers are connected depending on a required output power by switch circuits 115 to 118, and the power source is turned on only in the connected power amplifiers, while the other power amplifiers are turned off, and therefore by the lowering portion of the output power, the current consumption decreases in proportion, so that the equivalent high efficiency operation same as in the case maximum efficiency is realized.

23 Claims, 21 Drawing Sheets

HIGH EFFICIENCY LINEAR POWER AMPLIFIER OF PLURAL FREQUENCY BANDS AND HIGH EFFICIENCY POWER AMPLIFIER

BACKGROUND OF THE INVENTION

1. Field of the Invention

The present invention relates to a high efficiency linear power amplifier of plural frequency bands capable of using two or more plural frequency bands by changing over, and a high efficiency power amplifier used in cellular telephone, PHS and other mobile communication appliances.

2. Related Art of the Invention

Hitherto, as a high efficiency linear power amplifier of plural frequency bands, the constitution as shown in a block diagram in FIG. 7 has been known. In FIG. 7, in an input terminal 20 of frequency band A, for example, a signal of 950 MHz band (940 to 956 MHz) is entered, matched in impedance in a matching network 21, amplified in a pre-amplifier 22, matched in impedance in a matching network 23, amplified in a post-amplifier 24, matched in impedance in a matching network 25, and obtained as signal output of frequency band A of 940 to 956 MHz from an output terminal 26.

Similarly, in an input terminal 27 of frequency band B, for example, a signal of 1,900 MHz band (1895.15 to 1917.95 MHz) is entered, matched in impedance in a matching network 28, amplified in a pre-amplifier 29, matched in impedance in a matching network 30, amplified in a post-amplifier 31, matched in impedance in a matching network 32, and obtained as signal output of frequency band B of 1895.15 to 1917.95 MHz from an output terminal 33.

In such conventional high efficiency linear power amplifier of plural frequency bands, circuits of similar constitution are required in both frequency band A and frequency band B, and the number of parts is great and the occupation space is significant. Accordingly, as shown in FIG. 8, it is attempted to enter a signal of band A, that is, 940 to 956 MHz, or a signal of band B, that is, 1895.15 to 1917.95 MHz in an input terminal 34, adjust a wide band matching network 35 to match the impedance at frequencies in both frequency bands, amplify both frequency bands in a wide band pre-amplifier 36, match the impedance similarly in both frequency bands A and B in a wide band matching network 37, amplify in a wide band post-amplifier 38, match the impedance again in both frequency bands in a wide band matching network 39, change over the frequency bands in a switch circuit 40, and change over and issue to either an output terminal 41 for band A or an output terminal 42 for band B.

However, in this method, although the number of parts may be decreased, the problem is that the adjustment of the wide band matching network (in particular at the later stage) cannot be extremely improved in efficiency. FIG. 9 is an example of output impedance and load impedance of FET of the post-amplifier 38. Generally, the load impedance maximum in gain is a complex conjugate with the output impedance of the FET. Incidentally, the load impedance maximum in gain, the load impedance maximum in efficiency, and load impedance minimum in distortion differ in each frequency band.

Generally, in the post-amplifier 38, the emphasis is placed on low distortion or high efficiency, and in the wide band matching network 39, therefore, it is necessary to compose the matching network to realize such characteristics, but it is hard to design and the characteristics are likely to deteriorate because plural restraint conditions are present in plural frequency bands. In a switch circuit 40 using an electronic circuit, meanwhile, since the passing electric power is large, the elements to be used must have a large capacity, and the loss is large because it is used in a place of high power level, and the efficiency of the power amplifier cannot be enhanced.

Recently, cellular telephones are rapidly promoted in the trend of smaller size, lighter weight and lower cost. Accordingly, owing to the restriction of the battery used in the cellular telephones, the power amplifier is required to have both high efficiency and low voltage operation.

FIG. 19 shows an example of a constitution of a conventional power amplifier. In FIG. 19, reference numeral 194 is an input terminal, 195 is an output terminal, 196 is a transistor, 197 is a gate bias terminal, 198 is a drain bias terminal 199 is an input matching network, 200 is an output matching network, and 201, 202 are first and second DC blocking capacitors.

In thus constituted power amplifier, a conventional method of enhancing the efficiency is described below.

In the conventional power amplifier, a high efficiency is realized by adjusting the output matching network 200 connected to the transistor 196 so that the load impedance of the transistor 196 may have the maximum efficiency at a desired output power.

In this constitution, however, when the output power is lower than the specified output power, the efficiency drops as shown in FIG. 20.

SUMMARY OF THE INVENTION

It is hence an object of the invention to reduce the number of parts and elements, simplify the circuit structure, save the circuit space, present a high efficiency linear power amplifier of plural frequency bands of high efficiency, and present a power amplifier capable of maintaining a high efficiency characteristic same as initial output if the output power is lowered.

A high efficiency linear power amplifier of plural frequency bands of the first invention comprises pre-amplifying means connected to an input terminal for receiving signals in plural frequency bands, for amplifying the input signals of plural frequency bands, changeover means of plural frequency bands for changing over the output of the pre-amplifying means for issuing to any one of plural changeover terminals, and a plurality of post-amplifying blocks connected to each one of the plural changeover terminals of the changeover means of plural frequency bands, wherein each one of said plurality of post-amplifying blocks comprises single frequency band matching means for matching impedance between the output of the pre-amplifying means and input of a below-described post-amplifying means in a single frequency band, post-amplifying means for amplifying the output signal of the single frequency band matching means, post-matching means connected to the output of the post-amplifying means for matching the output impedance of the post-amplifying means in a single frequency band, and output terminal for issuing the output signal of the post-matching means.

In this constitution, up to the pre-amplifier, it is common in all frequency bands, and the circuit structure may be simplified by decreasing the number of circuit elements, and the changeover means of plural frequency bands is provided at a position of low power level, and the changeover element may be small, and moreover since the single frequency band matching means and post-matching means at high level leading to increase of undesired radiation due to increase of loss and worsening of linearity due to mismatching of load impedance are provided in each frequency band, the number of circuit elements can be decreased and the circuit structure can be simplified while maintaining a maximum circuit performance.

A high efficiency linear power amplifier of plural frequency bands of the second invention according to said first invention has the output of the pre-amplifying means which is connected to the changeover means of plural frequency bands through auxiliary matching means, and the auxiliary matching means which matches the impedance of the inputs of the pre-amplifying means and post-amplifying means in the operating frequency band through cooperation with the element of the single frequency band matching means in each frequency band. Further, a high efficiency linear power amplifier of plural frequency bands of the fourth invention according to said second invention, has the auxiliary matching means which is a grounded capacitance or low impedance line, and the single frequency band matching means which is an inductance.

In this constitution, in addition to the action and effect of the first invention, as the auxiliary matching means provided right after the pre-amplifying means cooperates with the circuit element in the single frequency band matching means provided after passing the changeover means of plural frequency bands, the capacitor is substantially shared by combination of the capacitance of the auxiliary matching network used commonly and the inductance of each single matching means, and therefore the number of circuit elements may be further decreased, and the output impedance of the transistor can be enhanced by the auxiliary matching network, thereby acting to improve the loss of the changeover means of plural frequency bands occurring due to low output impedance of transistor.

A high efficiency linear power amplifier of plural frequency bands of the third invention according to said first invention and said second invention, has wide band matching means for matching the impedance between the output of the pre-stage and the input of the pre-amplifying means in plural frequency bands which is provided between the input terminal and the pre-amplifying means. As an embodiment of this wide band matching means, a high efficiency linear power amplifier of plural frequency bands of the fifth invention according to said third invention has the wide band matching means which is a combination of a set of inductance and capacitance and a negative feedback amplifier. By employing this constitution, the gain may be further enhanced from said first and said second inventions.

The constitution of the sixth invention to the fourteenth invention show the constitution formed on a same semiconductor chip according to said first invention to said third invention, and the constitution of the sixth invention composes at least all constitution of said first to said third invention on the same semiconductor chip.

In the constitution in said sixth invention, the interval of parts can be narrowed, generation of unnecessary inductance or capacitance is prevented to stabilize the circuit operation, and the number of constituent parts can be decreased, and hence it is particularly suitable for mass production of products in same condition.

A high efficiency linear power amplifier of plural frequency bands of the seventh invention according to said first invention, has at least the pre-amplifying means, changeover means of plural frequency bands, plurality of single frequency band matching means, and plurality of post-amplifying means which are composed on a same semiconductor chip; a high efficiency linear power amplifier of plural frequency bands of the eighth invention according to said second invention, has at least the pre-amplifying means, auxiliary matching means, changeover means of plural frequency bands, plurality of single frequency band matching means, and plurality of post-amplifying means which are composed on a same semiconductor chip; a high efficiency linear power amplifier of plural frequency bands of ninth invention according to said third invention, has at least the wide band matching means, pre-amplifying means, changeover means of plural frequency bands, plurality of single frequency band matching means, and plurality of post-amplifying means which are composed on a same semiconductor chip; and a high efficiency linear power amplifier of plural frequency bands of the tenth invention according to said third invention, has at least the wide band matching means, pre-amplifying means, auxiliary matching means, changeover means of plural frequency bands, plurality of single frequency band matching means, and plurality of post-amplifying means which are composed on a same semiconductor chip.

In the constitution of the seventh invention to the tenth invention, in addition to the action of the sixth invention, the constituent elements to be formed on a same semiconductor chip are limited, and the versatility to be applicable to different output side conditions may be enhanced.

A high efficiency linear power amplifier of plural frequency bands of the eleventh invention according to said first invention, has at least the pre-amplifying means and changeover means of plural frequency bands which are composed on a same semiconductor chip; a high efficiency linear power amplifier of plural frequency bands of the twelfth invention according to said second invention, has at least the pre-amplifying means, auxiliary matching means, and changeover means of plural frequency bands which are composed on a same semiconductor chip; a high efficiency linear power amplifier of plural frequency bands of thirteenth invention according to said third invention, has at least the wide band matching means, pre-amplifying means, and changeover means of plural frequency bands which are composed on a same semiconductor chip; and a high efficiency linear power amplifier of plural frequency bands of the fourteenth invention according to said third invention has at least the wide band matching means, pre-amplifying means, auxiliary matching means, and changeover means of plural frequency bands which are composed on a same semiconductor chip.

In the constitution of the eleventh invention to the fourteenth invention, moreover, since the range included in a same semiconductor chip is limited, a semiconductor chip of higher versatility may be obtained.

A power amplifier of the fifteenth invention comprises at least two power amplifiers connected in parallel, and connects a necessary number of the power amplifiers depending on a required output power by the input branching means and output selecting means, and turns on those power source corresponding to the connected power amplifiers and turns off the others by the power source changeover means. Accordingly, if the output power is lowered from the maximum output power, the current consumption becomes smaller in proportion to the lowered portion of the output power, so that the same efficiency operation as in the case of maximum efficiency output is realized. Therefore, the invention is effective as the circuit constitution for varying the output power.

EMBODIMENTS (Embodiment 1)

Figure 1:
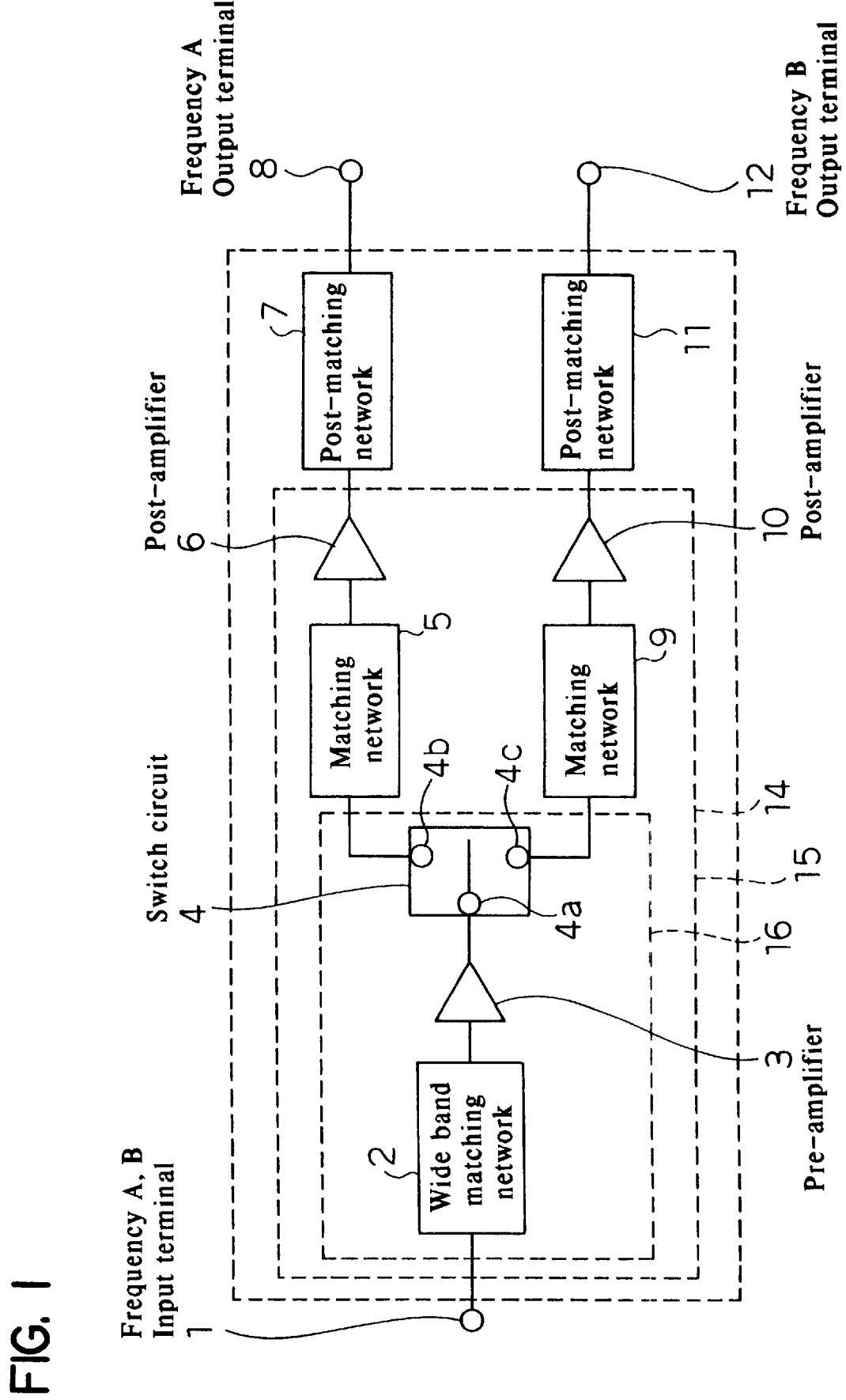
FIG. 1 is a block diagram of a high efficiency linear power amplifier of plural frequency bands in embodiment 1 of the invention.

Embodiment 1 of the invention is described below while referring to FIG. 1 and FIG. 2. In FIG. 1 which is a block diagram of a high efficiency linear power amplifier of plural frequency bands in embodiment 1 of the invention, an input terminal 1 common to frequency band A or first frequency band and frequency band B or second frequency band is connected to the input of a wide band matching network 2 or wide band matching means, and the output of the wide band matching network 2 is connected to the input of a pre-amplifier 3 or pre-amplifying means for amplifying commonly the frequency bands A and B, while the output of the pre-amplifier 3 is connected to a common terminal 4a of a switch circuit 4 or changeover means of plural frequency bands.

One changeover terminal 4b of the switch circuit 4 is connected to the input of a matching network 5 for frequency band A or single frequency band matching means, and the output of the matching network 5 is connected to the input of a post-amplifier 6 or post-amplifying means for band A, and the output of the post-amplifier 6 is connected to an output terminal 8 for frequency band A through a post-matching network 7 or post-matching means exclusive for frequency band A. The matching network 5, post-amplifier 6, and post-matching network 7 for frequency band A form a post-amplifying block for frequency band A.

On the other hand, other changeover terminal 4c of the switch circuit 4 is connected to the input of a matching network 9 or signal frequency band matching means for frequency band B, and the output of the matching circuit 9 is connected to the input of a post-amplifier 10 for band B as post-amplifying means, while the output of the post-amplifier 10 is connected to an output terminal 12 for frequency band B through a post-matching network 11 or post-matching means exclusive for frequency band B. The matching network 9, post-amplifier 10, and post-matching network 11 for frequency band B form a post-amplifying block for frequency band B.

In thus constituted embodiment, the operation is described below. As band A, for example, a signal of 940 to 956 MHz is handled same as in the prior art, and as band B, similarly, a signal of 1895.15 to 1917.95 MHz is handled. When amplifying the frequency band A, by changing over the common terminal 4a of the switch circuit 4 to the changeover terminal 4b side and feeding a signal of 940 to 956 MHz from the input terminal 1, in this case, it is matched in impedance by the wide band matching network 2 capable of matching impedance in a frequency range of 940 to 1917.95 MHz, and amplified by the pre-amplifier 3, and its output is sent into the changeover terminal 4b side from the common terminal 4a of the switch circuit 4, so that the impedance is matched in the matching network 5 for frequency band A, that is, 940 to 956 MHz. The output of the matching network 5 is fed into the post-amplifier 6 for band A to be amplified, and its output is matched in impedance by the post-matching circuit 7 exclusive for frequency band A, and is issued into the output terminal 8 for frequency band A.

When amplifying band B, incidentally, by changing over the common terminal 4a of the switch circuit 4 to the changeover terminal 4c side, and feeding a signal of 1895.15 to 1917.95 MHz from the input terminal 1, it is matched in impedance by the wide band matching network 2 capable of matching impedance in a frequency range of 940 to 1917.95 MHz, and is amplified in the pre-amplifier 3, and its output is sent into the changeover terminal 4c side from the common terminal 4a of the switch circuit 4, and is matched in frequency by the matching network 9 for frequency band B, that is, 1895.15 to 1917.95 MHz. The output of the matching network 9 is fed into the post-amplifier 10 for band B, and is amplified, and its output is matched in impedance in the post-matching network 11 exclusive for frequency band B, and is issued into the output terminal 12 for frequency band B. The input signals applied to the input terminal 1 may be generated separately for frequency bands A and B, or may be common for plural bands same as in the embodiment.

Figure 2:
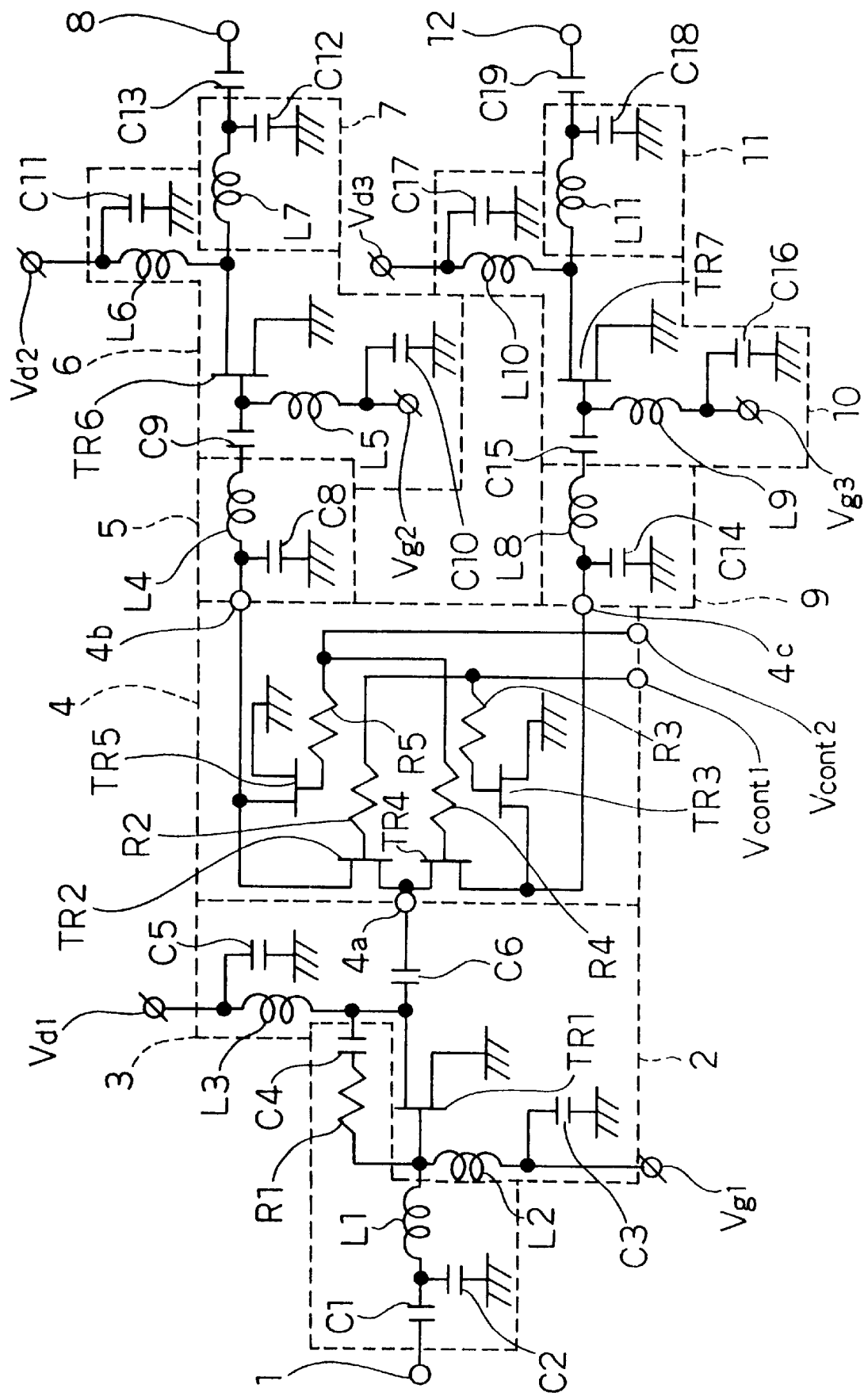
FIG. 2 is its specific circuit diagram.

FIG. 2 show a specific circuit diagram of the block diagram of FIG. 1. In FIG. 2, the input terminal 1 common to frequency bands A and B is connected to a series circuit of a coupling capacitor C1 and a capacitor C2, C2 is grounded, and from the junction point of C1 and C2, a coil L1 is connected to the gate of a transistor TR1.

Hereinafter, all Transistors are Field Effect Transistors (FETs) for High Frequency The source of the transistor TR1 is grounded, the gate is provided with a bias voltage through a coil L2 by bypass from voltage Vg1 through capacitor C3, and the drain is provided with a voltage through a coil L3 of load by bypass from voltage Vd1 through capacitor C5, thereby composing a pre-amplifier 3. Between the drain and gate, negative feedback is applied by capacitor C4 and resistor R1, the band of impedance matching of the matching network by the input side capacitor C2 and coil L1 is widen and stabilized, and the both are combined to form the wide band matching network 2.

The switch circuit 4 is composed of transistors TR2 to TR4 and resistors R2 to R5, the individual drains of the transistors TR2, TR4 are coupled to form the common terminal 4a, and a capacitor C6 is connected between it and the drain of the transistor TR1. In the switch circuit 4 as connected in FIG. 2, by application of voltage into terminal Vcont1, the transistor TR2 is turned on to conduct between the common terminal 4a and changeover terminal 4b, and by turning on the transistor TR3, the leak from the common terminal 4a to the changeover terminal 4c is grounded so as to disconnect conduction between the common terminal 4a and terminal 4c. By application of voltage to Vcont2, the transistor TR4 is turned on to conduct between the common terminal 4a and changeover terminal 4c, and by turning on the transistor TR5, the leak from the common terminal 4a to the changeover terminal 4b is grounded so as to disconnect conduction between the common terminal 4a and changeover terminal 4b.

The changeover terminal 4b of the switch circuit 4 is connected to the matching network 5 for frequency band A composed of coil L4 and capacitor C8, and the other end of the capacitor C8 is grounded, while the other end of the coil L4 is connected to the gate of the post-transistor TR6 through a capacitor C9. The source of the transistor TR6 is grounded, and by bypass from voltage Vg2 through capacitor C10, a bias voltage is applied to the gate through the coil L5, and on the other hand, by bypass from voltage Vd2 through capacitor C11, a voltage is applied to the drain through a load coil L6, thereby composing a post-amplifier 6 for band A. In the post-amplifier 6, since nonlinear distortion causes an unfavorable undesired radiation, linear amplification of ultimate linearity of input and output is required by adjustment of the post-matching network 7 or matching of circuit condition.

Herein, the drain of the transistor TR6 is connected to one end of the coil L7 for composing the post-matching network 7 exclusive for frequency band A together with capacitor C12, and the other end of the coil L7 is grounded through capacitor C12 and is also connected to an output terminal 8 for frequency band A through capacitor C13.

Between the changeover terminal 4c of the switch circuit 4 and the output terminal 12 for frequency band B, a similar constitution is formed, and the other changeover terminal 4c of the switch circuit 4 is connected to coil L8 and capacitor C14 for composing the matching network 9 for frequency band B, the other end of the capacitor C14 is grounded, and the other end of the coil L8 is connected to the gate of the post-transistor TR7 through the capacitor C15. The post-transistor TR7, same as the transistor TR6, composes a post-amplifier 10 for band B together with capacitors C16, C17 and coils L9, L10, and the drain of the transistor TR7 is connected to a coil L11 for composing a post-matching network 11 exclusive for frequency band B together with capacitor C18, while the other end of the coil L11 is grounded at capacitor C18, and is connected to the output terminal 12 for frequency band B through capacitor C19.

In thus constituted embodiment, the operation is described below. First, when amplifying band A, a control voltage is applied to terminal Vcont1, then the transistors TR2, TR3 are turned on through resistors R2, R3, so that the common terminal 4a of the switch circuit 4 is changed over to the changeover terminal 4b side. Feeding a signal of 940 to 956 MHz from the input terminal 1, the impedance is matched in a wide frequency range of 940 to 1917.95 MHz, by the matching network by gate side capacitor C2 and coil L1, and wide band matching network 2 formed by negative feedback by resistor R1 and capacitor C4 connected to the gate from the drain of the transistor TR1. Being amplified in the pre-amplifier 3 composed of the transistor TR1, its output is sent from the common terminal 4a of the switch circuit 4 to the changeover terminal 4b side, and the impedance is matched in the matching network 5 for frequency band A, that is, 940 to 956 MHz formed of the capacitor C8 and coil L4. The output of the matching network 5 is fed into the post-amplifier 6 for band A composed of transistor TR6 through the capacitor C9, and is amplified, and its output is issued into the output terminal 8 for frequency band A after being matched in impedance by the post-matching network 7 exclusive for frequency band A composed of coil L7 and capacitor C12.

When amplifying band B, a control voltage is applied to terminal Vcont2, then the transistors TR4, TR5 are turned on through resistors R4, R5, so that the common terminal 4a of the switch circuit 4 is changed over to the changeover terminal 4c side, and by feeding a signal of 1895.15 to 1917.95 MHz from the input terminal 1, the impedance is matched in a frequency range of 940 to 1917.95 MHz, by the matching network by capacitor C2 and coil L1, and wide band matching network 2 formed by negative feedback by resistor R1 and capacitor C4 connected to the gate from the drain of the transistor TR1. Being amplified in the pre-amplifier 3 composed of the transistor TR1, its output is sent from the common terminal 4a of the switch circuit 4 to the changeover terminal 4c, side, and the impedance is matched in the matching network 9 for frequency band B, that is, 1895.15 to 1917.95 MHz formed of the capacitor C14 and coil L15. The output of the matching network 9 is fed into the post-amplifier 10 for band B composed of transistor TR7, and is amplified, and its output is issued into the output terminal 12 for frequency band B after being matched in impedance by the post-matching network 11 exclusive for frequency band B composed of coil L11 and capacitor C18.

In matching of each matching network, the matching networks 5, 9 for matching between the output impedance and load impedance of the pre-amplifier 3 are respectively exclusive for each single frequency band, and the post-matching networks 7, 11 for matching the post-amplifiers 6, 10 are also exclusive for single frequency band individually, and therefore the restraining conditions are alleviated and the design is easier, so that a large gain may be obtained in the pre-amplifier 3, and moreover the matching networks 5, 9 may be composed so as to realize such a load as to obtain maximum gain at a single frequency, whereas the post-matching networks 7, 11 for matching the post-amplifiers 6, 10 may be composed to realize characteristics having the main purposes in low distortion or high efficiency characteristic.

In the embodiment, two frequency bands are suggested, but by increasing the number of circuits of the switch circuit 4 and adding the matching networks and post-amplifiers, it is applicable to three or more or n frequency bands, so that the reducing effect of the number of elements may be further enhanced.

Thus, according to the embodiment, the constitution is common up to the pre-amplifier 3 in all frequency bands, and the number of circuit elements can be decreased and the circuit structure can be simplified, and the changeover switch circuit 4 is provided at a position of low power level, and the elements of the changeover circuit may be small, and moreover since the matching networks at high level leading to increase of undesired radiation due to increase of loss and worsening of linearity due to mismatching of load impedance are provided in each frequency band, the matching networks can be designed easily and the circuit structure can be simplified while maintaining a maximum circuit performance.

(Embodiment 2)

Figure 3:
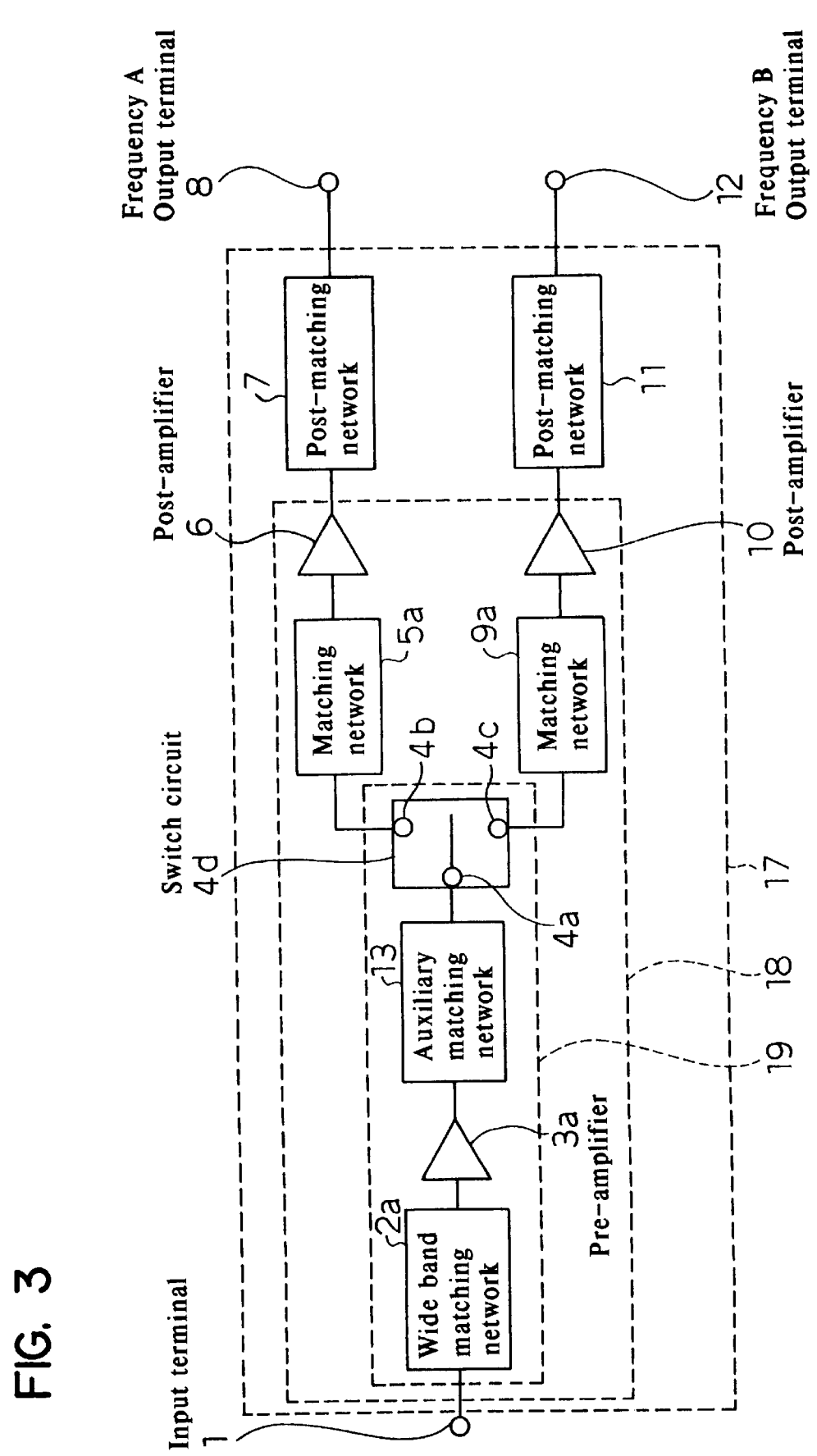
FIG. 3 is a block diagram of a high efficiency linear power amplifier of plural frequency bands in embodiment 2 of the invention.

Embodiment 2 of the invention is described below while referring to FIG. 3 and FIG. 4. In FIG. 3 which is a block diagram of a high efficiency linear power amplifier of plural frequency bands in embodiment 2 of the invention, the difference from embodiment 1 in FIG. 1 lies in the change of constitution of the wide band matching network 2a and the provision of auxiliary matching network 13 right after the pre-amplifier 3a, and hence the constitution of the matching networks 5a, 9a in each frequency band is changed accordingly. As a result, part of the matching elements of the matching networks 5a, 9a of band A and band B is shared in the auxiliary matching network 13 and the number of matching elements is decreased. It is specifically described below together with the detailed circuit diagram in FIG. 4.

Figure 4:
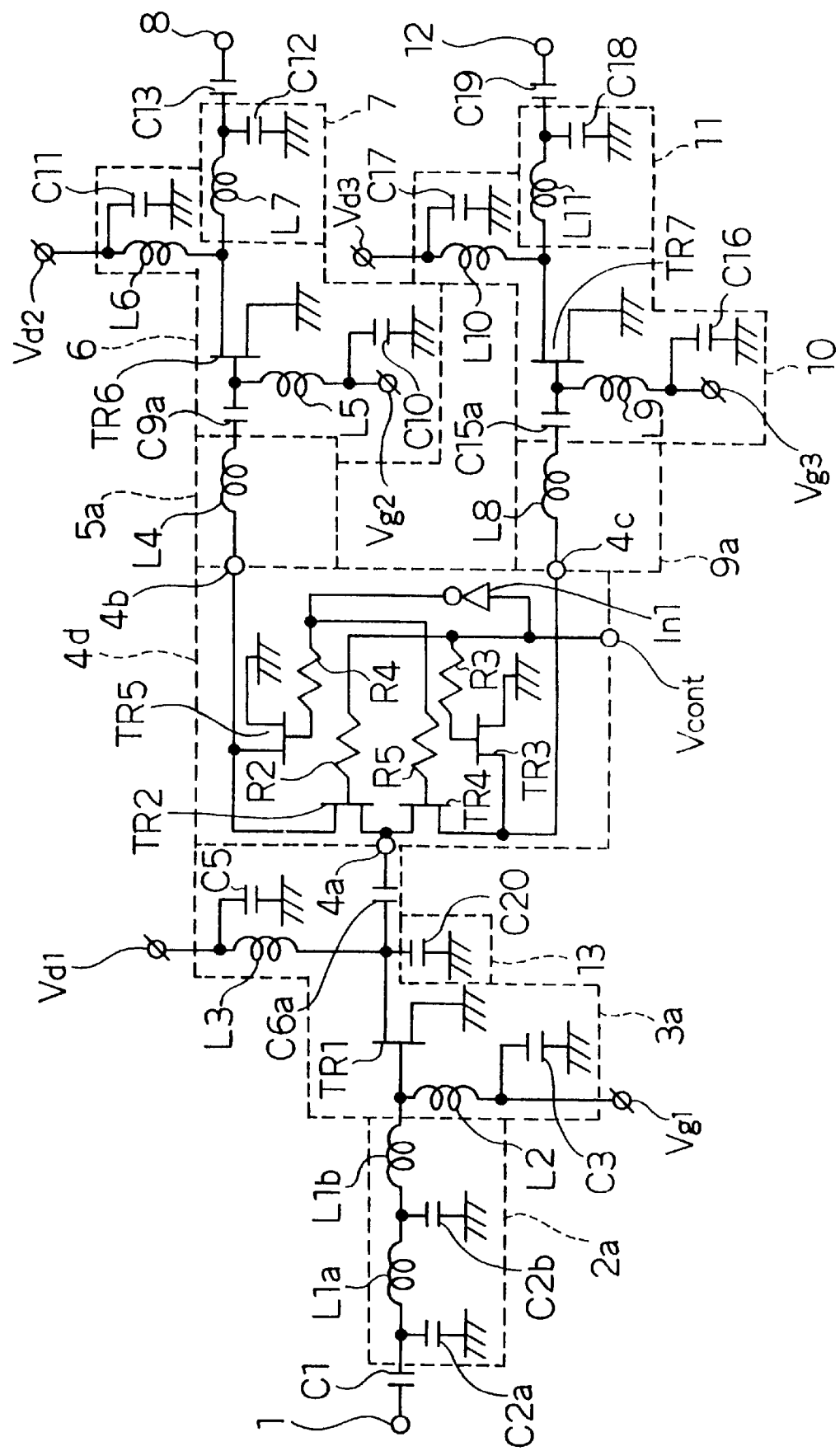
FIG. 4 is its specific circuit diagram.

In FIG. 4, same functional parts as in FIG. 2 relating to embodiment 1 are identified with same reference numerals, and description is omitted. At other end of a coupling capacitor C1 connected to an input terminal 1, a coil L1a and a capacitor C2a are connected, the other end of a capacitor C2a is grounded, a coil L1b and a capacitor C2b are connected to other end of the coil L1a, the other end of the capacitor C2b is grounded, and the other end of the coil L1b is connected to the gate of transistor TR1. Different from embodiment 1, a wide band matching network 2a is formed of coils L1a, L1b, and capacitors C2a, C2b. In FIG. 2 relating to embodiment 1, the transistor TR1 is fed back to realize wide band and stability, but the gain is larger when feedback is not applied. In this case, however, the design is difficult, and hence it should be selected in consideration of the advantages and disadvantages.

Between the drain of the transistor TR1 and the ground, a capacitor C20 is connected as capacitance of the auxiliary matching means 13, and a coupling capacitor C6a is connected between the drain of the transistor TR1 and a common terminal 4a of a switch circuit 4d. At a terminal 4b of the switch circuit 4d, a coil L4 is connected as inductance of single frequency band matching means. The other end of the coil L4 is connected to the gate of the transistor TR6 through a coupling capacitor C9a. On the other hand, at the changeover terminal 4c of the switch circuit 4d, a coil L8 is connected as inductance of single frequency band matching means, and the other end of the coil L8 is connected to the gate of transistor TR7 through a coupling capacitor C15a. A matching network 5a for band A is composed of capacitor C20 and coil L4. A matching network 9a for band B is composed of capacitor C20 and coil L8. Since the capacitor C20 is commonly used in two matching networks, and hence it is formed as auxiliary matching network 13. Since the capacitor 20 is common to both matching networks, the capacitors can be decreased by one, and since the capacitor 20 is disposed at this position, the loss due to low output impedance of the transistor TR1 can be improved.

This reason is explained by referring to FIG. 5. Generally, the output impedance of the pre-stage or post-stage FET is a low impedance closed to a shorted one. Supposing the output impedance of the FET to be 5 ohms, by matching the matching network so as to obtain conjugate impedance including the matching network, on the load of 50 ohms at point X1 in FIG. 5(a), when the output load is set to 5 ohms as shown in the equivalent circuit in FIG. 5(b), a maximum gain is achieved. However, as shown in FIG. 3 and FIG. 4, since the switch circuit 4d is provided behind the pre-amplifier 3a, and when this loss is expressed as in FIG. 5(c), since the output impedance of the FET is low, the loss in the switch circuit 4d cannot be ignored. Supposing this resistance value to be 2.5 ohms, since the output load impedance of the FET is 5 ohms as shown in the equivalent circuit in FIG. 5(d), the impedance of the switch circuit is 2.5 ohms, and the apparent impedance of the matching network containing the load is 2.5 ohms, and the gain is reduced to half.

Figure 5A:
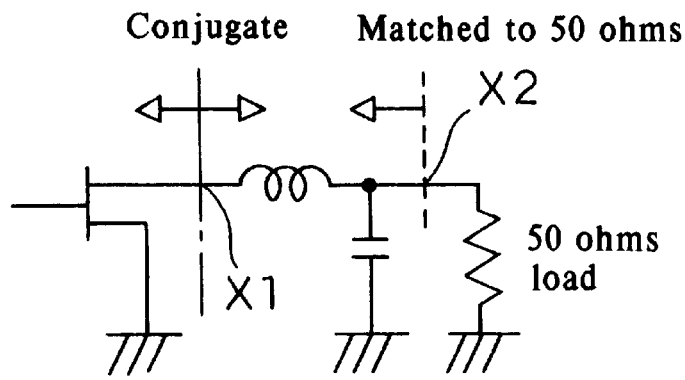
FIG. 5 is an operation explanatory diagram of a matching network of the same.
Figure 5B:
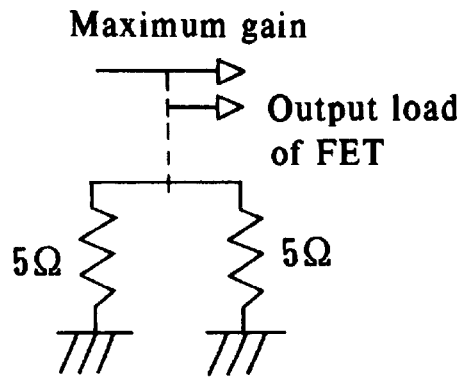
Figure 5C:
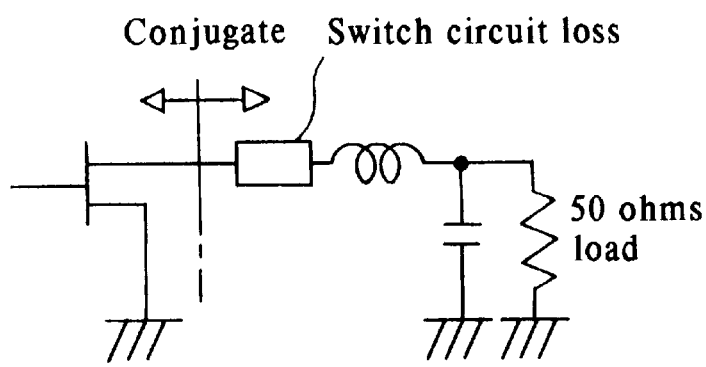
Figure 5D:
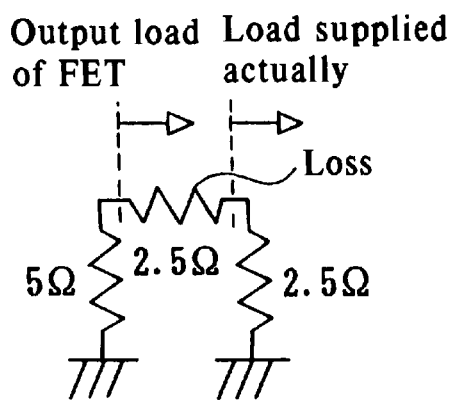
Figure 5E:
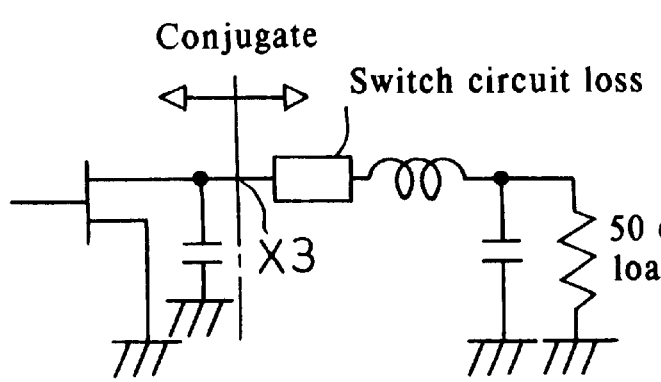
Figure 5F:
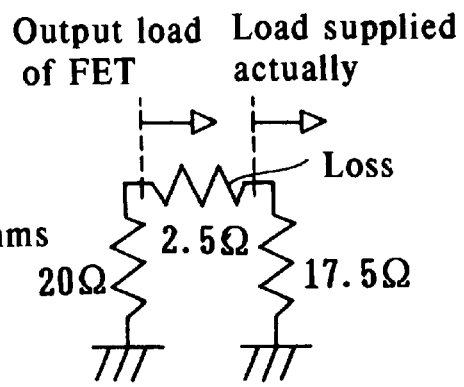

In this embodiment, using the auxiliary matching network 13 by capacitor C20, the output impedance as seen from point X3 in FIG. 5(e) to FET side is higher, and supposing to be heightened to 20 ohms, the apparent load impedance excluding the loss of the switching circuit at maximum gain is 17.5 ohms, and the corresponding switching circuit loss is smaller in rate as compared with FIG. 5(d), as indicated in the equivalent circuit in FIG. 5(f), so that the loss of the switch circuit does not matter much.

Figure 6:
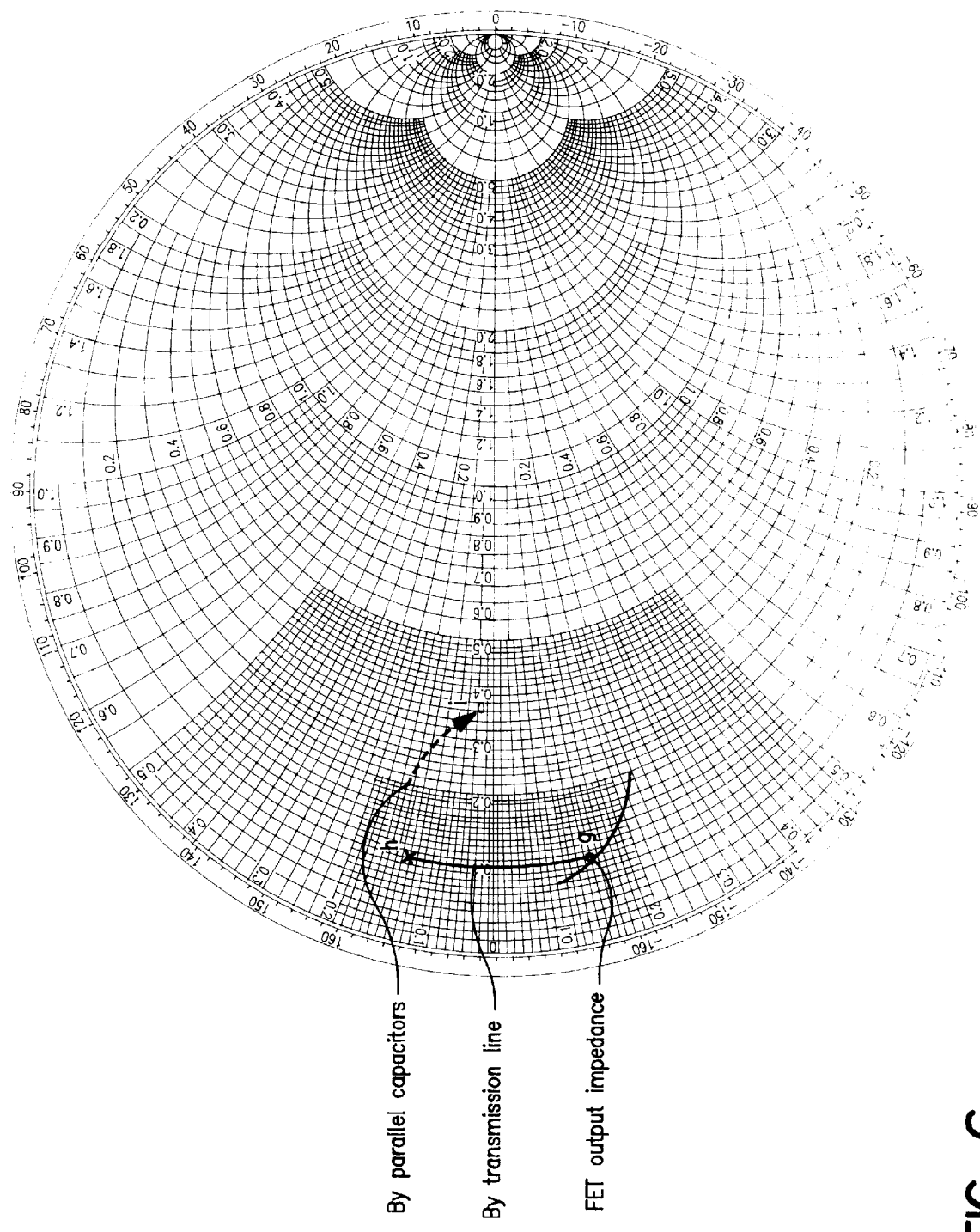
FIG. 6 is an operation explanatory diagram of an auxiliary matching network of the same.
Figure 7:
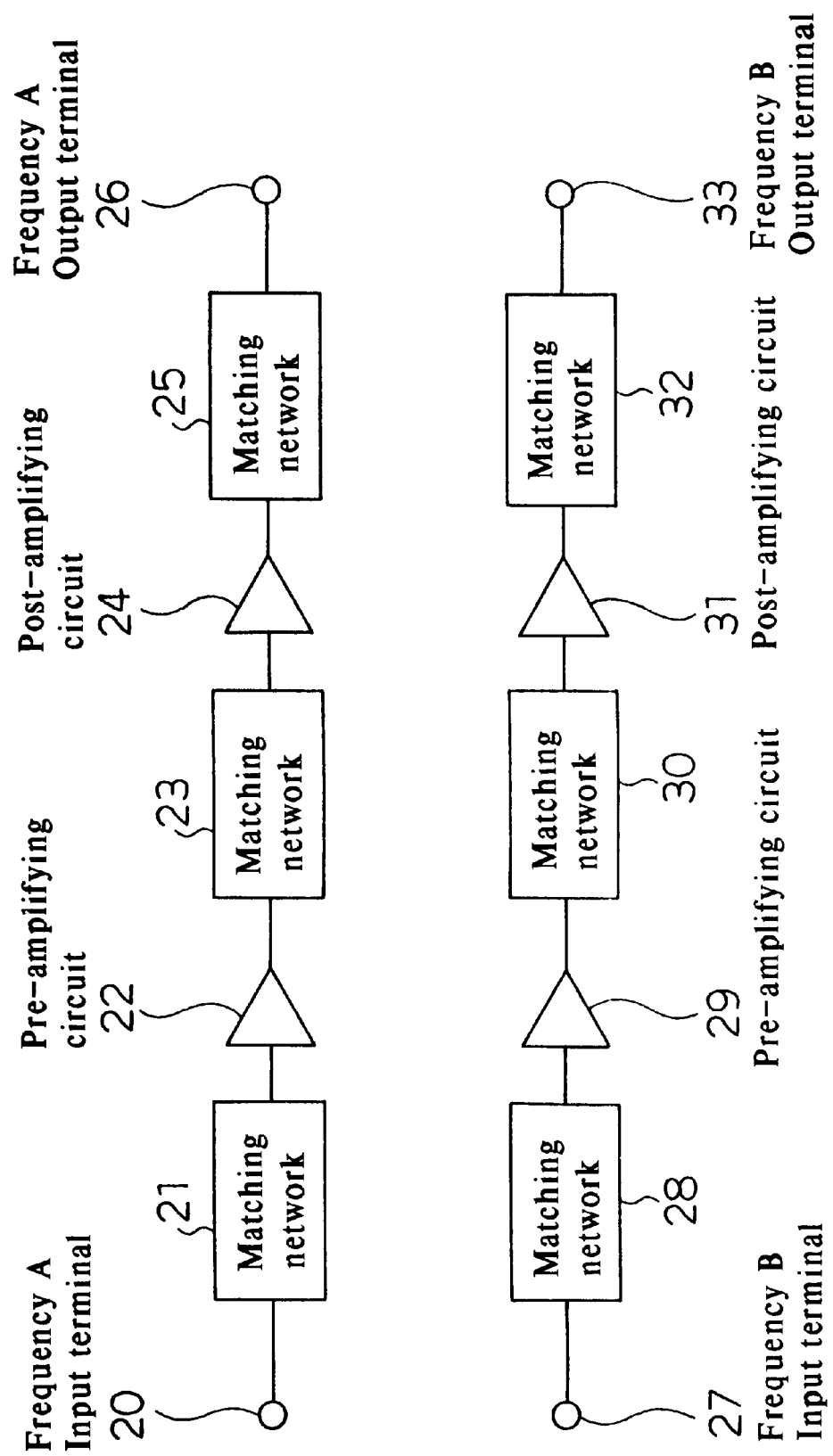
FIG. 7 is a block diagram of a high efficiency linear power amplifier of plural frequency bands in a prior art.
Figure 8:
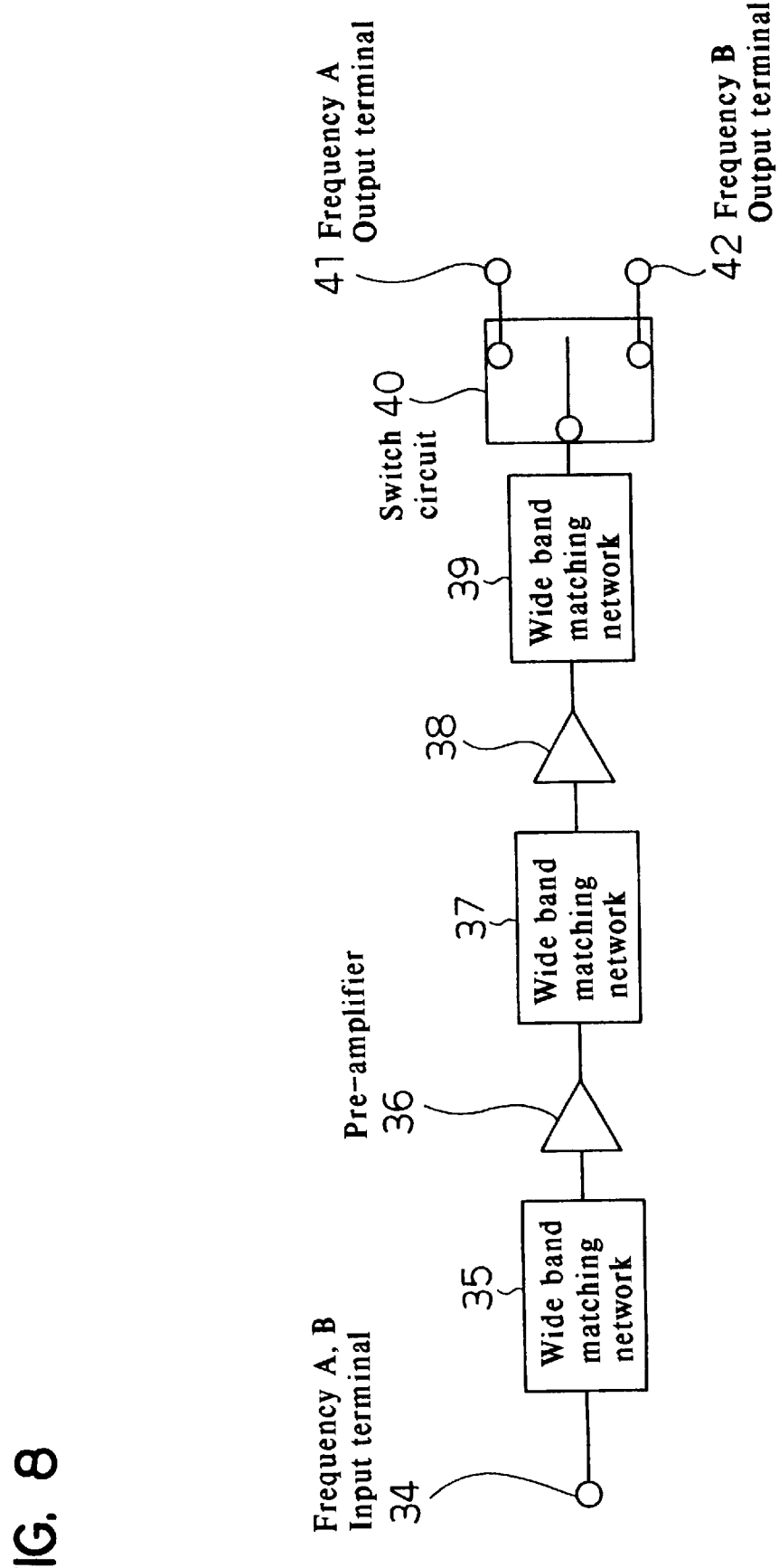
FIG. 8 is a block diagram of a high efficiency linear power amplifier of plural frequency bands in other prior art.
Figure 9:
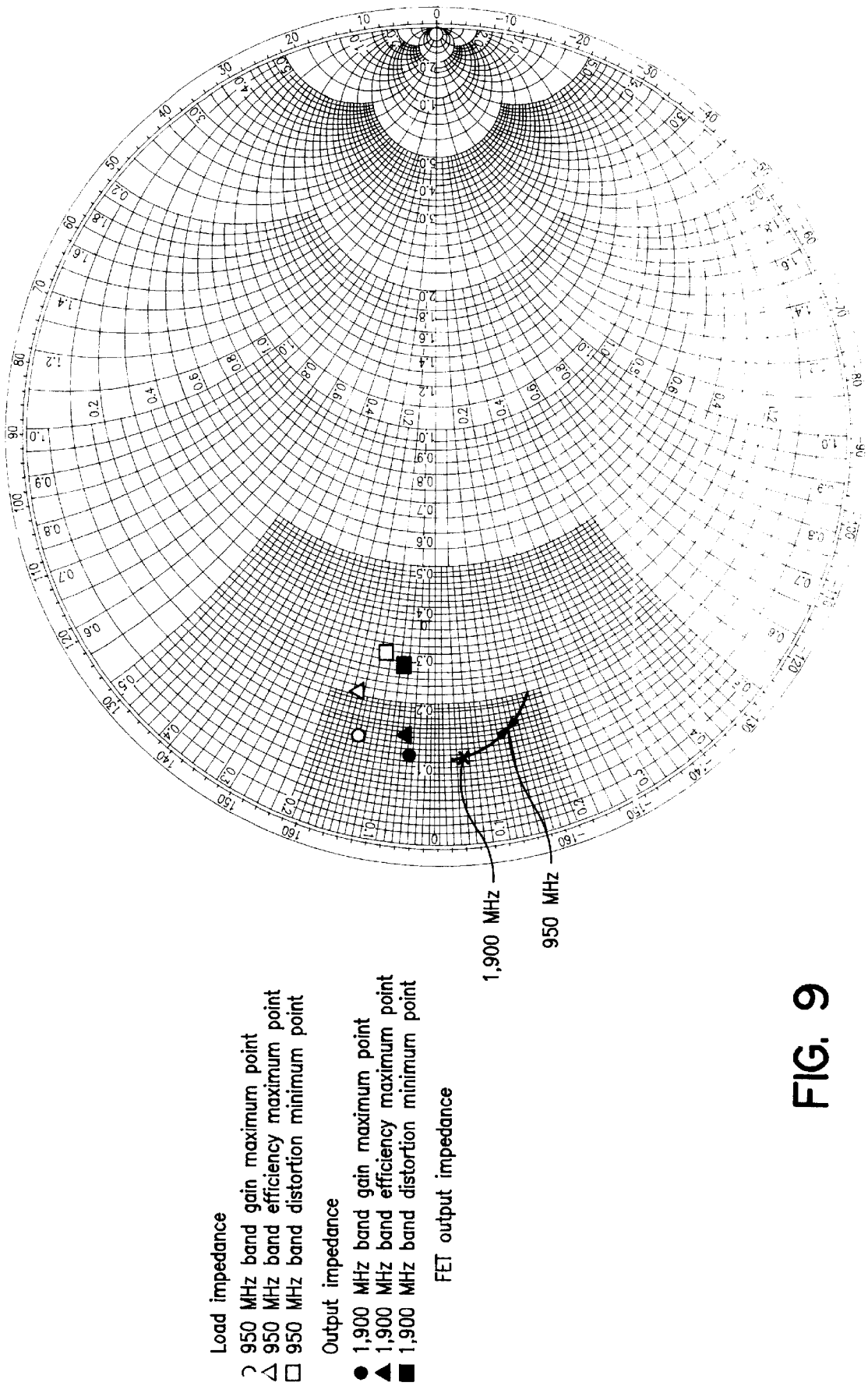
FIG. 9 is an impedance chart showing output impedance and load impedance of a post-amplifier.

Referring now to FIG. 6, a process of elevation of output impedance of FET by auxiliary matching network 13 is explained. In FIG. 6, when the output impedance of FET is a low impedance (for example, 5 ohms), being at position of capacitive point g in Smith chart, it is converted into an impedance at point h at upper side (inductive side) of the diagram due to the effect of transmission line (package pin or bonding wire of FET). Further, by disposing the capacitor C20 in parallel thereto, it is converted into an impedance at point i (for example, 20 ohms) at the inside of Smith chart as shown in the diagram.

Incidentally, the difference between the switch circuit 4d and the switch circuit 4 in FIG. 2 is to apply control voltage to the resistors R4, R5 through an inverter In1, and hence what differs from FIG. 2 is that the connection of the switch circuit is changed by setting the control voltage to positive or negative, and the difference of the two is not essential.

The bias voltage to the gates of the transistors TR1, TR6, TR7 may be also applied through the resistors, instead of the coils L2, L5, L9 in FIG. 4, as far as a high impedance is obtained. In the illustrated coils, if the frequency becomes high, needless to say, they may be replaced by micro strip lines or other inductance elements.

Thus, in the embodiment, in addition to the action and effect of embodiment 1, the auxiliary matching network 13 is disposed right after the pre-amplifier 3a, and the circuit elements, that is, capacitors, of the matching networks 5a, 9a for band A and band B provided after the auxiliary matching network 13 passes the switch circuit 4d are commonly shared, and the number of circuit elements can be decreased, and moreover since the output impedance of the FET is raised by the capacitor C20 provided at the output of the pre-amplifier 3a, the loss at the switching circuit 4d is relatively decreased, and the loss due to low output impedance of FET can be improved. In this case, instead of the capacitor C20, by using a low impedance line of broad width, this low impedance line acts as capacitance, not as inductance, so that the same effect as the capacitor may be obtained.

In this embodiment, too, two frequency bands are suggested, but by increasing the number of circuits of the switch circuit and adding the matching networks and post-amplifiers, it is applicable to three or more or n frequency bands, so that the reducing effect of the number of elements may be further enhanced.

In both embodiments 1 and 2, the wide band matching network provided right after the input terminal 1 may be omitted if the loss of gain can be ignored.

(Embodiment 3)

The circuit in embodiments 1 and 2 is formed into an integrated circuit in this embodiment. The whole block in FIG. 1, that is, the area enclosed by broken line 14, or the whole block in FIG. 3, that is, the area enclosed by broken line 17 is realized on a same semiconductor chip. By thus composing, the interval of parts is narrowed, occurrence of unnecessary inductance or capacitance is prevented, the circuit operation is stabilized, and the number of constituent parts is decreased, so that it is preferable when producing products in same condition in a large quantity.

Incidentally, to cope with different external conditions of the output terminals 8, 12, the post-matching networks 7, 11 are provided as external parts, and the area enclosed by broken line 15 in FIG. 1, that is, the block including the wide band matching network 2, pre-amplifier 3, switch circuit 4, matching networks 5, 9, and post-amplifiers 6, 10, or the area enclosed by broken line 18 in FIG. 3, that is, the block including the wide band matching network 2a, pre-amplifier 3a, auxiliary matching network 13, switch circuit 4d, matching networks 5a, 9a, and post-amplifiers 6, 10 is realized on a same semiconductor chip, and this method is known to be versatile and suited to a wide variety of models, considering the production quantity and others. Similarly, the area enclosed by broken line 16 in FIG. 1, that is, the block including the wide band matching network 2, pre-amplifier 3, and switch circuit 4, or the area enclosed by broken line 19 in FIG. 3, that is, the block including the wide band matching network 2a, pre-amplifier 3a, auxiliary matching network 13, and switch circuit 4d only may be realized on a same semiconductor chip. This case is applicable to different frequency ranges or outputs, and is also preferable in the case where the power of the post-amplifier is high and heat generation causes effects on other parts.

Herein, the portion enclosed by broken line after the input terminal 1 is formed on a same semiconductor chip, but at least including this area, the circuit before the input terminal 1 may be formed together on a same semiconductor chip.

The illustrated number of pieces, and numerical values of impedance of frequency are arbitrary and not limitative.

In the foregoing embodiments, the detail of the circuit structure may be freely modified or replaced by other circuit having similar functions, and the detail may be changed within the scope of the claims of the invention, and it is not limited to the illustrated circuit design alone.

(Embodiment 4)

Figure 10:
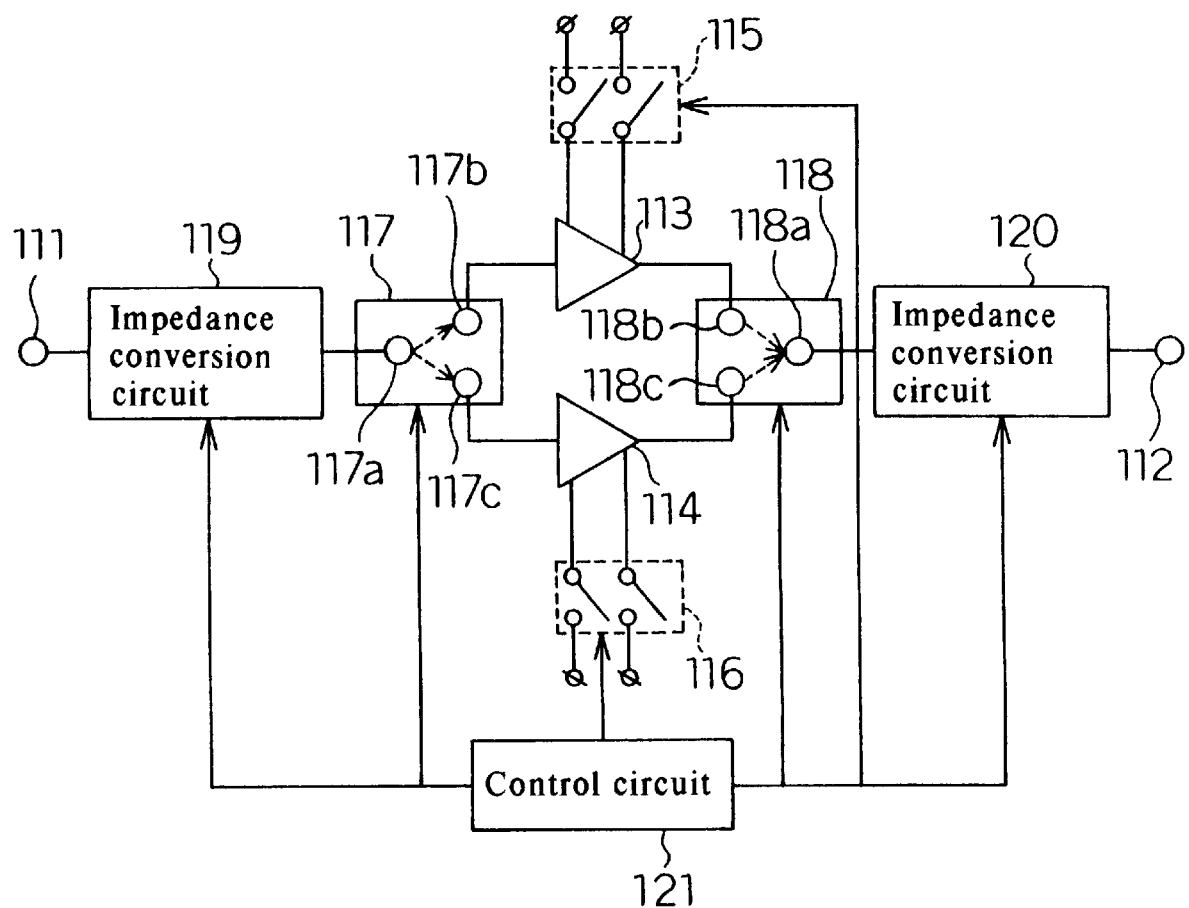
FIG. 10 is a block diagram showing a constitution of embodiment 4 of the invention.

FIG. 10 shows a high efficiency power amplifier in embodiment 4 of the invention. In FIG. 10, reference numeral 111 is an input terminal, 112 is an output terminal, 113, 114 are first and second power amplifiers, 115, 116 are first and second switch circuits as power source changeover means for turning on or off the bias of the first and second power amplifiers 113, 114, 117 is a third switch circuit as input branching means, 118 is a fourth switch circuit as output selecting means, 119, 120 are first and second impedance conversion circuits, and 121 is a control circuit for controlling the first to fourth switch circuits 115 to 118 and first and second impedance conversion circuits 119, 120. A terminal 117a of the third switch circuit 117 is a first common terminal, and a terminal 118a of the fourth switch circuit 118 is a second common terminal.

In thus constituted high efficiency power amplifier, the operation is described below while referring to the drawing.

In the circuit in FIG. 10, the first power amplifier 113 is set in active state when the terminals 117a and 117b of the third switch circuit 117 and the terminals 118a and 118b of the fourth switch circuit 118 are connected respectively and the first switch circuit 115 is turned on to apply bias. On the other hand, the second power amplifier 114 is set in active state when the terminals 117a and 117c of the third switch circuit 117 and the terminals 118a and 118c of the fourth switch circuit 118 are connected respectively and the second switch circuit 116 is turned on to apply bias. Or, by connecting the terminals 117a, 117b, and 117c of the third switch circuit 117 simultaneously, and connecting the terminals 118a, 118b, and 118c of the fourth switch circuit 118 also simultaneously, and by turning on the first and second switch circuits 115, 116, both first and second power amplifiers 113, 114 are set in active state, and the output from the first power amplifier 113 and the output from the second power amplifier 114 are combined, and a double output appears at the output terminal 112. The switches in the first to fourth switch circuits 115 to 118 operate switching by receiving a signal from the control circuit 121.

The first and second impedance conversion circuits 119, 120 change in the impedance as seen from the terminal 117a to the power amplifier side, and in the impedance as seen from the terminal 118a to the power amplifier side, depending on the number of power amplifiers connected, and these circuits are intended to convert the impedance depending on such changes, and control according to the signal from the control circuit 121.

For example, suppose the output power is 500 mW, voltage is 5 V, and current consumption is 200 mA at the maximum efficiency of the first and second power amplifiers 113, 114. First, when setting the output power the maximum output of 1 W, both first and second power amplifiers 113, 114 are set in active state. The efficiency at this time is calculated in the formula, efficiency=output power/ (voltage×current consumption)×100 (%), and since the voltage is 5 V and current consumption is 400 mA, it is 50%. On the other hand, when the output power is lowered to 500 mW, one of the first and second power amplifiers 113, 114 is set in active state while the other is turned off, since the output power is half, 500 mW, the current consumption is also half, 200 mA, so that the maximum efficiency can be maintained.

(Embodiment 5)

Figure 11:
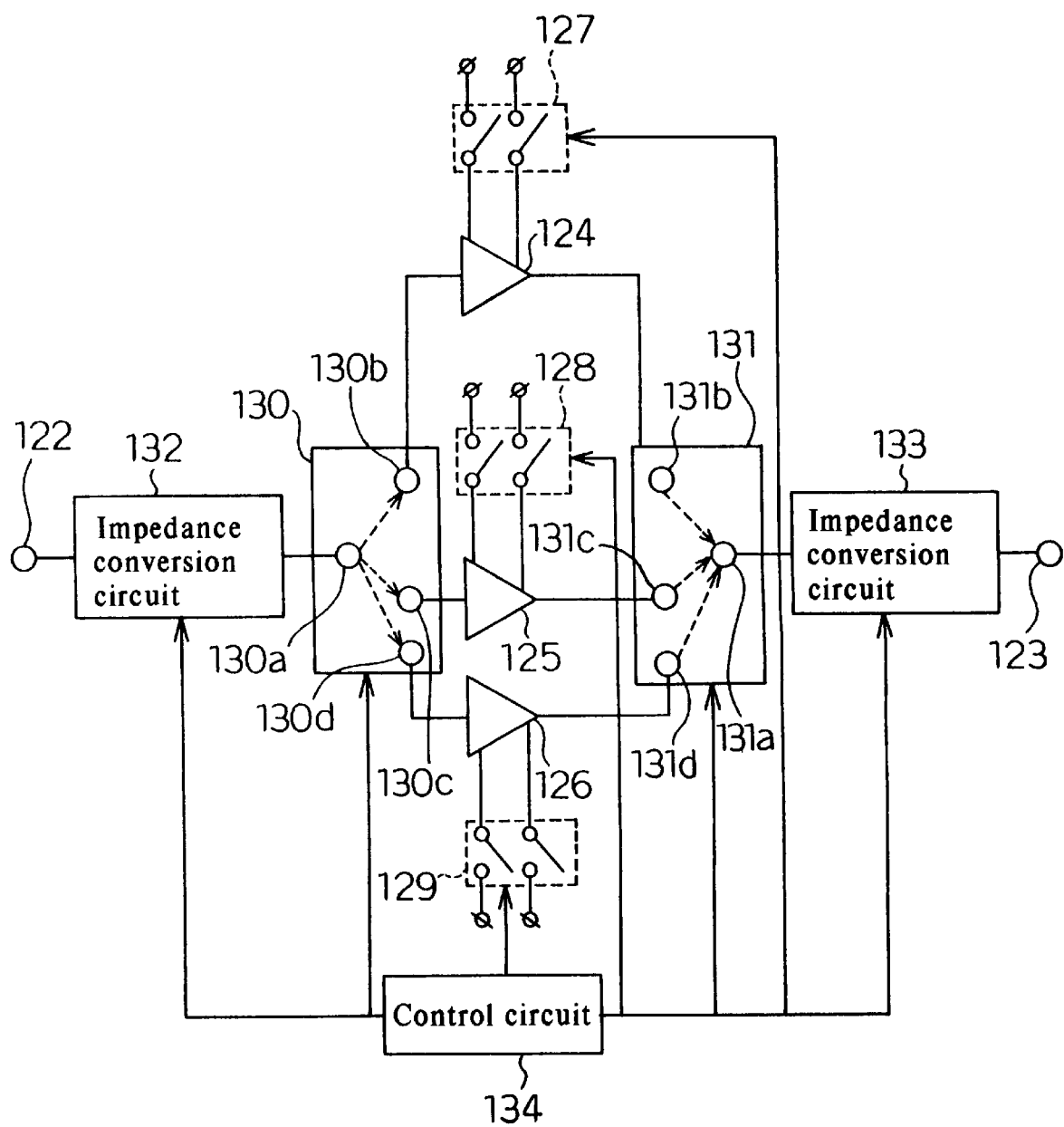
FIG. 11 is a block diagram showing a constitution of embodiment 5 of the invention.

FIG. 11 shows a high efficiency power amplifier in embodiment 5 of the invention. In FIG. 11, reference numeral 122 is an input terminal, 123 is an output terminal, 124, 125, 126 are first, second and third power amplifiers, 127, 128, 129 are first, second and third switch circuits as power source changeover means for turning on or off the bias of the first, second and third power amplifiers 124, 125, 126, 130 is a fourth switch circuit as input branching means, 131 is a fifth switch circuit as output selecting means, 132, 133 are first and second impedance conversion circuits, and 134 is a control circuit for controlling the first to fifth switch circuits 127 to 131 and first and second impedance conversion circuits 132, 133. A terminal 130a of the fourth switch circuit 130 is a first common terminal, and a terminal 131a of the fifth switch circuit 131 is a second common terminal.

In thus constituted high efficiency power amplifier, its operation is described below while referring to the drawing.

In the circuit in FIG. 11, the first power amplifier 124 is set in active state when the terminals 130a and 130b of the fourth switch circuit 130 and the terminals 131a and 131b of the fifth switch circuit 131 are connected respectively and the first switch circuit 127 is turned on to apply bias. On the other hand, the second power amplifier 125 is set in active state when the terminals 130a and 130c of the fourth switch circuit 130 and the terminals 131a and 131c of the fifth switch circuit 131 are connected respectively and the second switch circuit 128 is turned on to apply bias. Similarly, the third power amplifier 126 is set in active state when the terminals 130a and 130d of the fourth switch circuit 130 and the terminals 131a and 131d of the fifth switch circuit 131 are connected respectively and the third switch circuit 129 is turned on to apply bias. In the fourth and fifth switch circuits 130, 131, a plurality of power amplifiers can be connected simultaneously.

First, to maximize the output power, the first, second and third power amplifiers 124, 125, 126 are set in active state simultaneously. On the other hand, to lower the output power from the maximum output power, of the first to third power amplifiers 124, 125, 126, by operating only 124 and 125, or 124 and 126, or 125 and 126, or 124 or 125 or 126 only, and turning off the others, the output power is lowered, and the current consumption is smaller proportionally, so that the efficiency at the maximum output may be maintained.

In this explanation, three power amplifiers are connected in parallel, but it is the same when four or more power amplifiers are connected in parallel, and if the output power is lowered, it is evident that the efficiency at the maximum output is maintained.

In embodiments 4 and 5, the individual power amplifiers are identical in characteristics, but at least one power amplifier may differ in the output power. For example, when using three power amplifiers having the same maximum efficiency and different output powers of 100 mW, 200 mW, and 300 mW, by the combination of the power amplifiers to be connected, the output power may be varied in six states form the maximum output of 600 mW to 500 mW, 400 mW, 300 mW, 200 mW, and 100 mW, and at each output the efficiency is maintained at the same efficiency at the maximum output.

(Embodiment 6)

Figure 12:
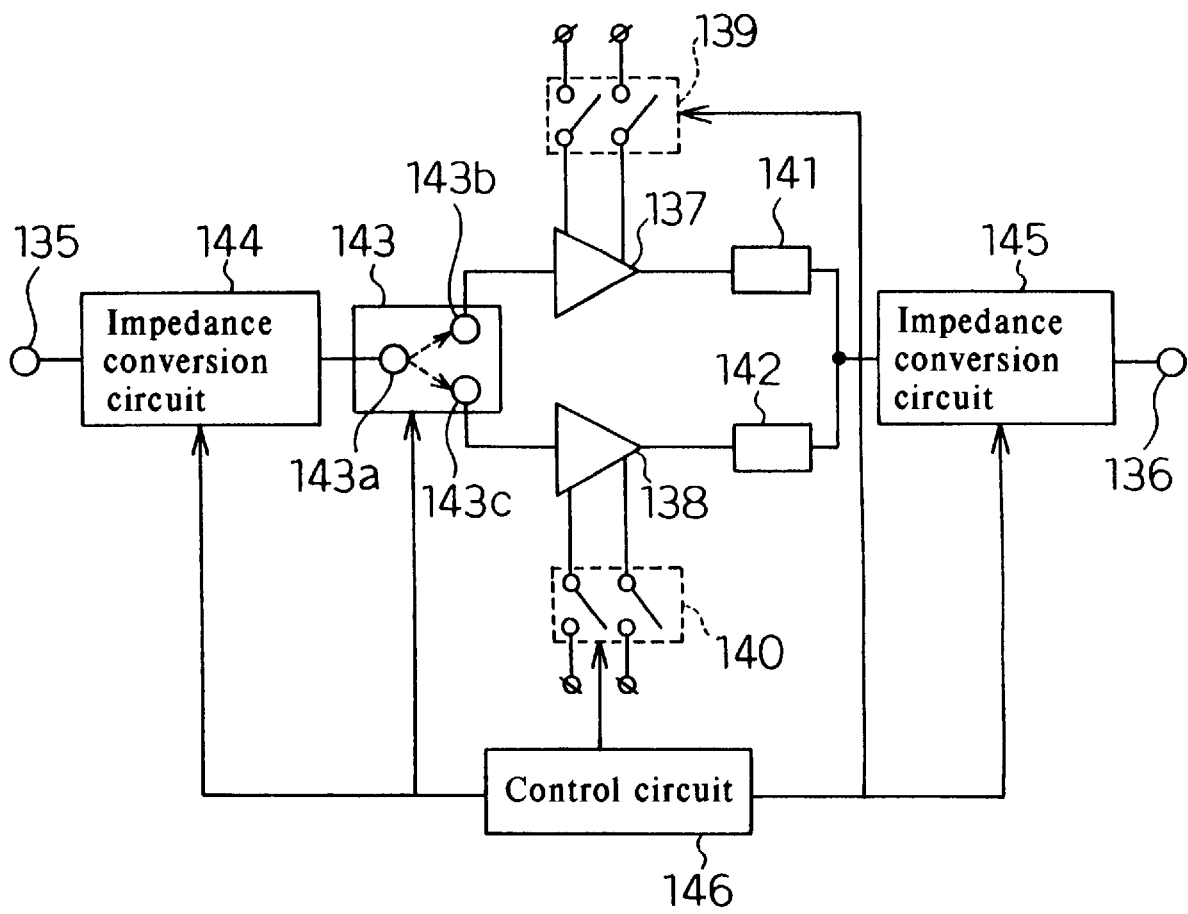
FIG. 12 is a block diagram showing a constitution of embodiment 6 of the invention.

FIG. 12 shows a high efficiency power amplifier in embodiment 6 of the invention. In FIG. 12, reference numeral 135 is an input terminal, 136 is an output terminal, 137, 138 are first and second power amplifiers, 139, 140 are first and second switch circuits as power source changeover means for turning on or off the bias of the first and second power amplifiers 137, 138, 141, 142 are first and second strip lines as transmission lines, 143 is a third switch circuit as input branching means, 144, 145 are first and second impedance conversion circuits, and 146 is a control circuit for controlling the first to third switch circuits 139, 140, 143 and first and second impedance conversion circuits 144, 145. This embodiment is similar to embodiment 4, excluding the switch circuit at the output side. A terminal 143a of the third switch circuit 143 is a common terminal.

In thus constituted high efficiency power amplifier, the operation is described below while referring to the drawing.

In FIG. 12, the first power amplifier 137 is set in active state when the terminals 143a and 143b of the third switch circuit 143 are connected and the first switch circuit 139 is turned on to apply bias. On the other hand, the second power amplifier 138 is set in active state when the terminals 143a and 143c of the third switch circuit 143 are connected and the second switch circuit 140 is turned on to apply bias. In the third switch circuit 143, the first and second power amplifiers 137, 138 can be connected simultaneously.

Figure 13:
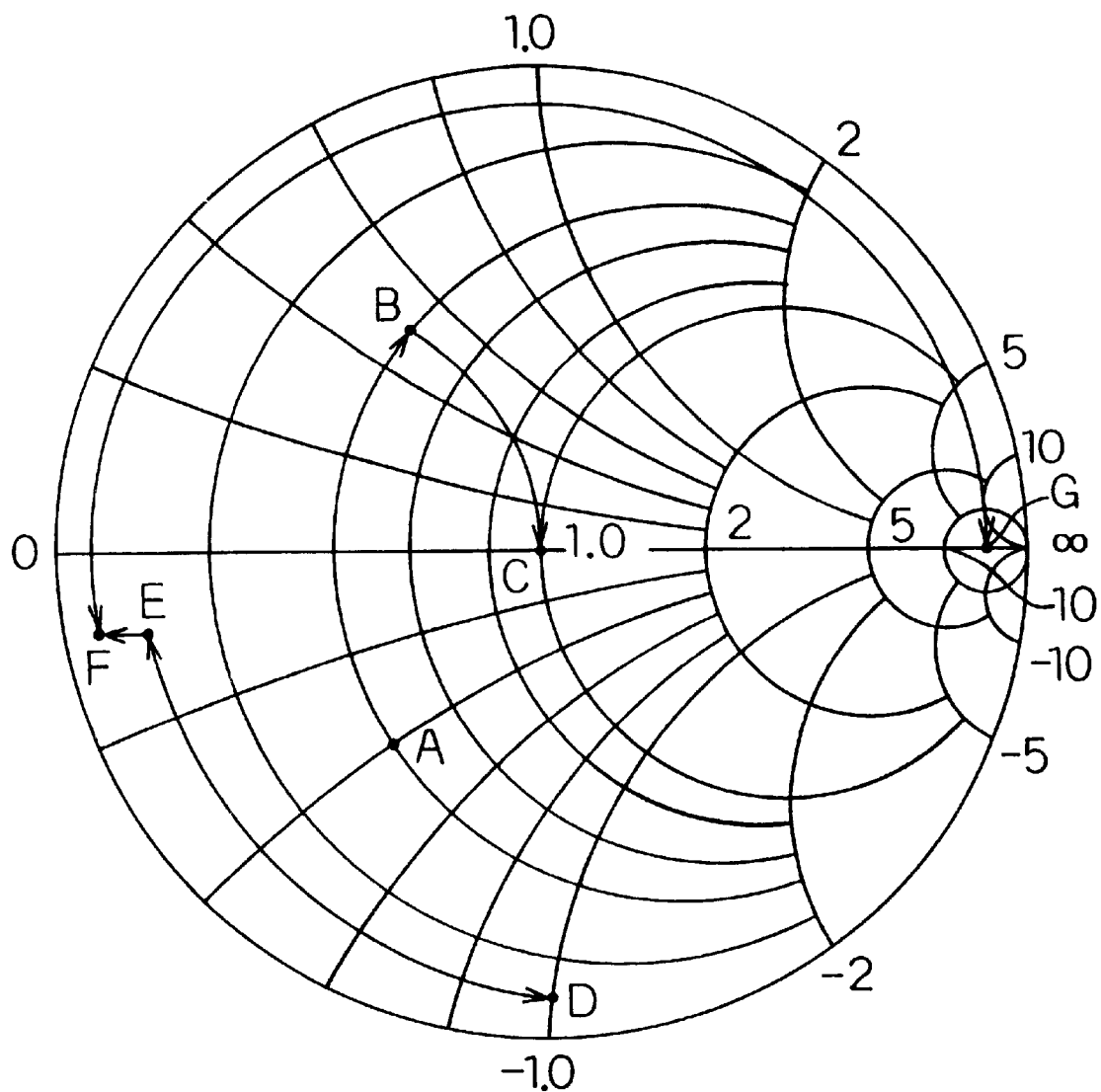
FIG. 13 is a Smith chart by on/off switching of bias of a power amplifier.

Generally, when a drain bias is applied to the first and second power amplifiers 137, 138, the output impedance of the FET alone used in the power amplifier has its operating frequency at point A in Smith chart in FIG. 13. At this time, the output matching network in the power amplifier is adjusted so that the output impedance of the power amplifier may come to the position of point C. On the other hand, when the drain bias of the first and second power amplifiers 137, 138 is turned off, the output impedance of the FET alone used in the power amplifier has its operating frequency at point D in Smith chart in FIG. 13. At this time, the output impedance of the power amplifier is adjusted to the position of point F by the output matching network.

First, suppose to set only the first power amplifier 137 in active state. Part of the signal passing through the first strip line 141 leaks into the second power amplifier 138 side to cause loss because the output side is always connected. However, since the power source is turned off in the second power amplifier 138, the output impedance of the second power amplifier 138 is positioned at point F in FIG. 13, and therefore by adjusting the length of the second strip line 142 so that the impedance seen from the output side of the second strip line 142 to the input side may be a high impedance (point G in FIG. 13), the loss due to leak can be reduced. Similarly, when setting only the second power amplifier 138 in active state, by adjusting the length of the first strip line 141, the loss due to leak can be reduced.

In this constitution, the same effect as in embodiment 4 is obtained. Moreover, since the output side switch circuit is omitted, the control circuit 146 is simplified from embodiment 4.

In this constitution, two power amplifiers are connected in parallel, but three or more may be connected as in embodiment 5. At least one of the power amplifiers may have a different output power from the other.

In the embodiment, the strip lines are used, but the operation is the same when other transmission lines than the strip lines are used.

(Embodiment 7)

Figure 14:
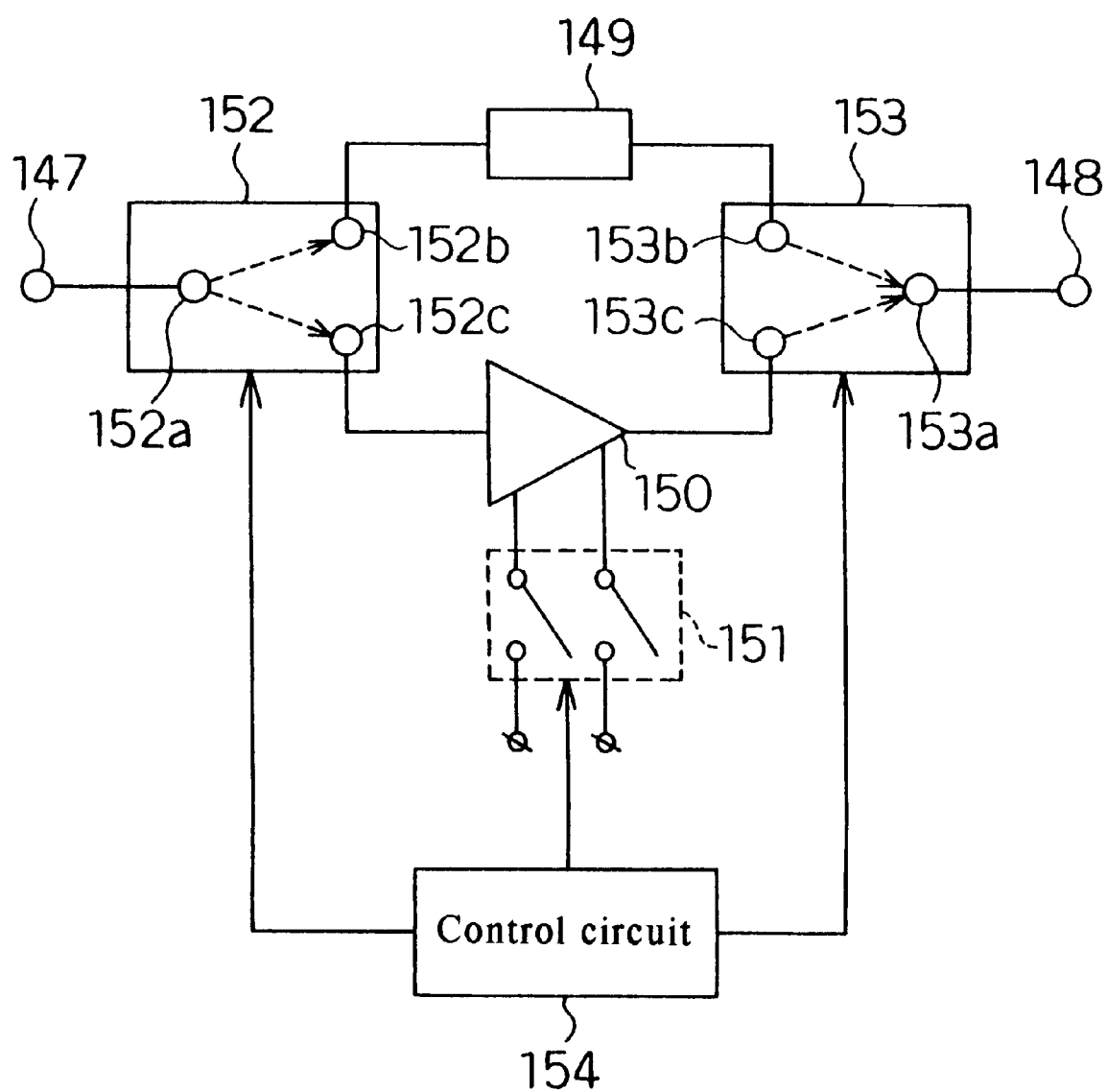
FIG. 14 is a block diagram showing a constitution of embodiment 7 of the invention.

FIG. 14 shows a high efficiency power amplifier in embodiment 7 of the invention. In FIG. 14, reference numeral 147 is an input terminal, 148 is an output terminal, 149 is a strip line as transmission line, 150 is a power amplifier, 151 is a first switch circuit as power source changeover means for turning on or off the bias of the power amplifier 150, 152 is a second switch circuit as input branching means, 153 is a third switch circuit as output selecting means, and 154 is a control circuit for controlling the first to third switch circuits 151, 152, 153. A terminal 152a of the second switch circuit 152 is a first common terminal, and a terminal 153a of the third switch circuit 153 is a second common terminal.

In thus constituted high efficiency power amplifier, the operation is described below while referring to the drawing.

In the circuit in FIG. 14, the power amplifier 150 is set in active state when the terminals 152a and 152c of the second switch circuit 152 and the terminals 153a and 153c of the third switch circuit 153 are connected respectively and the first switch circuit 151 is turned on to apply bias. On the other hand, when the terminals 152a and 152b of the second switch circuit 152 and the terminals 153a and 153b of the third switch circuit 153 are connected respectively, the strip line 149 is set in conductive state, and the signal entering the input terminal 147 is not amplified, but is directly sent out into the output terminal 148.

Figure 15:
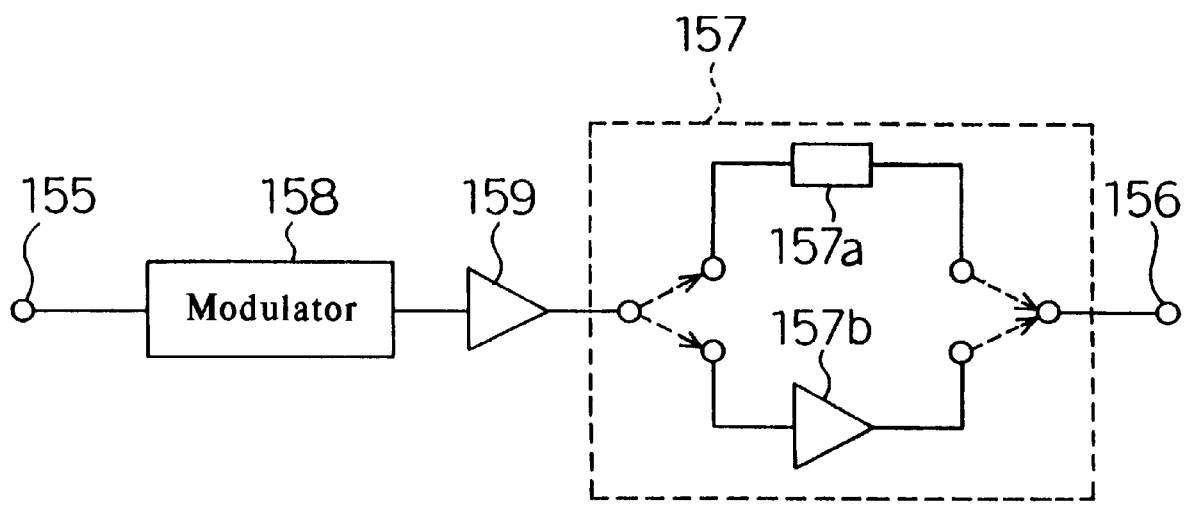
FIG. 15 is a block diagram of using the power amplifier in embodiment 7 in a transmission circuit of a cellular telephone.

The power amplifier of the embodiment is applied in a transmission circuit of a cellular telephone shown in FIG. 15. In FIG. 15, reference numeral 155 is an input terminal, 156 is an output terminal, 157 is the high efficiency power amplifier of the embodiment, 158 is a modulator, and 159 is a buffer amplifier. Its operation is described below.

Suppose the power of the signal after passing through the buffer amplifier 159 to be Pa (dBm), and the gain of the power amplifier 157b of the high efficiency power amplifier 157 of the embodiment to be G (dB). When the power amplifier 157b of the high efficiency power amplifier 157 of the embodiment is connected, the output power appearing at the output terminal 156 is Pa+G (dBm). If changing the output power to Pa (dBm), in the conventional power amplifier not provided with the strip line 157a, unlike the high efficiency power amplifier 157 of the embodiment, an attenuator is inserted between the buffer amplifier 159 and power amplifier, or the power of the signal after passing through the buffer amplifier 159 must be lowered to Pa−G (dBm), and hence the total efficiency of the transmission circuit is lowered. In the high efficiency power amplifier 157 of the embodiment, on the other hand, since the strip line 157a is connected, the signal after the buffer amplifier 159 can be directly issued to the output terminal 156 without being amplified, and the total efficiency of the transmission circuit is enhanced because the power amplifier 157b is turned off.

The strip line is explained herein, but the operation is the same by using other transmission line than the strip line.
(Embodiment 8)

Figure 16:
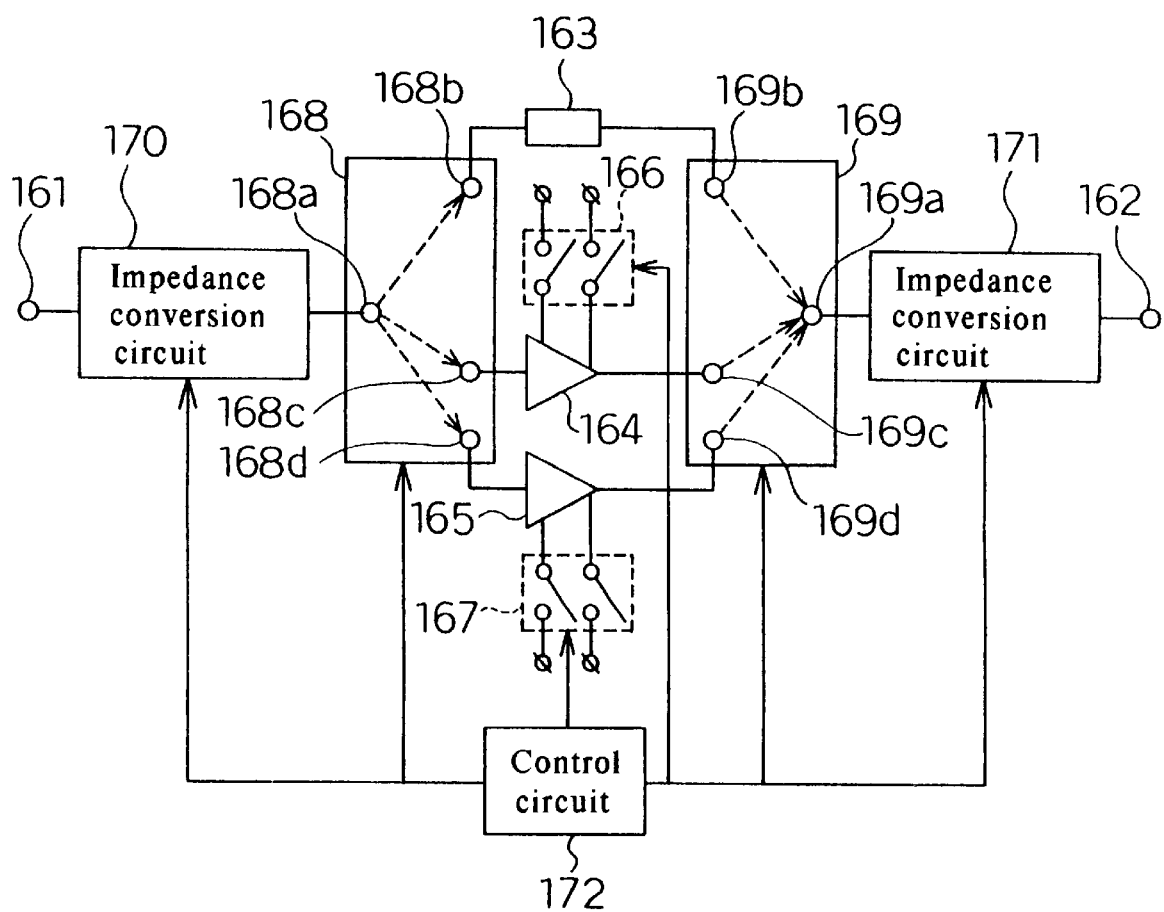
FIG. 16 is a block diagram showing a constitution of embodiment 8 of the invention.

FIG. 16 shows a high efficiency power amplifier in embodiment 8 of the invention. In FIG. 16, reference numeral 161 is an input terminal, 162 is an output terminal, 163 is a strip line as transmission line, 164, 165 are first and second power amplifiers, 166, 167 are first and second switch circuits as power source changeover means for turning on or off the bias of the first and second power amplifiers 164, 165, 168 is a third switch circuit as input branching means, 169 is a fourth switch circuit as output selecting means, 170, 171 are first and second impedance conversion circuits, and 172 is a control circuit for controlling the first to fourth switch circuits 166 to 169 and first and second impedance conversion circuits 170,171. A terminal 168a of the third switch circuit 168 is a first common terminal, and a terminal 169a of the fourth switch circuit 169 is a second common terminal.

In thus constituted high efficiency power amplifier, the operation is described below while referring to the drawing.

In the circuit in FIG. 16, when the terminals 168a and 168b of the third switch circuit 168 and the terminals 169a and 169b of the fourth switch circuit 169 are not connected, and the strip line 163 is cut off, the operation is same as in embodiment 4. On the other hand, when only the terminals 168a and 168b of the third switch circuit 168 and the terminals 169a and 169b of the fourth switch circuit 169 are connected, and the strip line 163 is conducting, same as in the amplifier with gain 0 dB, the signal entering the input terminal 161 is not amplified, but is directly sent out into the output terminal 162.

Same as in embodiment 7, when the high efficiency power amplifier of the embodiment shown in FIG. 16 is applied in a transmission circuit of a cellular telephone, the strip line 163 functions to enhance the total efficiency of the transmission circuit, and the first and second power amplifiers 164, 165 function to maintain the efficiency at the maximum output if the output power is lowered from the maximum output power.

In the embodiment, two power amplifiers are connected in parallel, but three or more power amplifiers may be connected as in embodiment 5. At least one of the power amplifiers may have a different output power from the others.

The strip line is explained herein, but the operation is the same by using other transmission line than the strip line.
(Embodiment 9)

Figure 17:
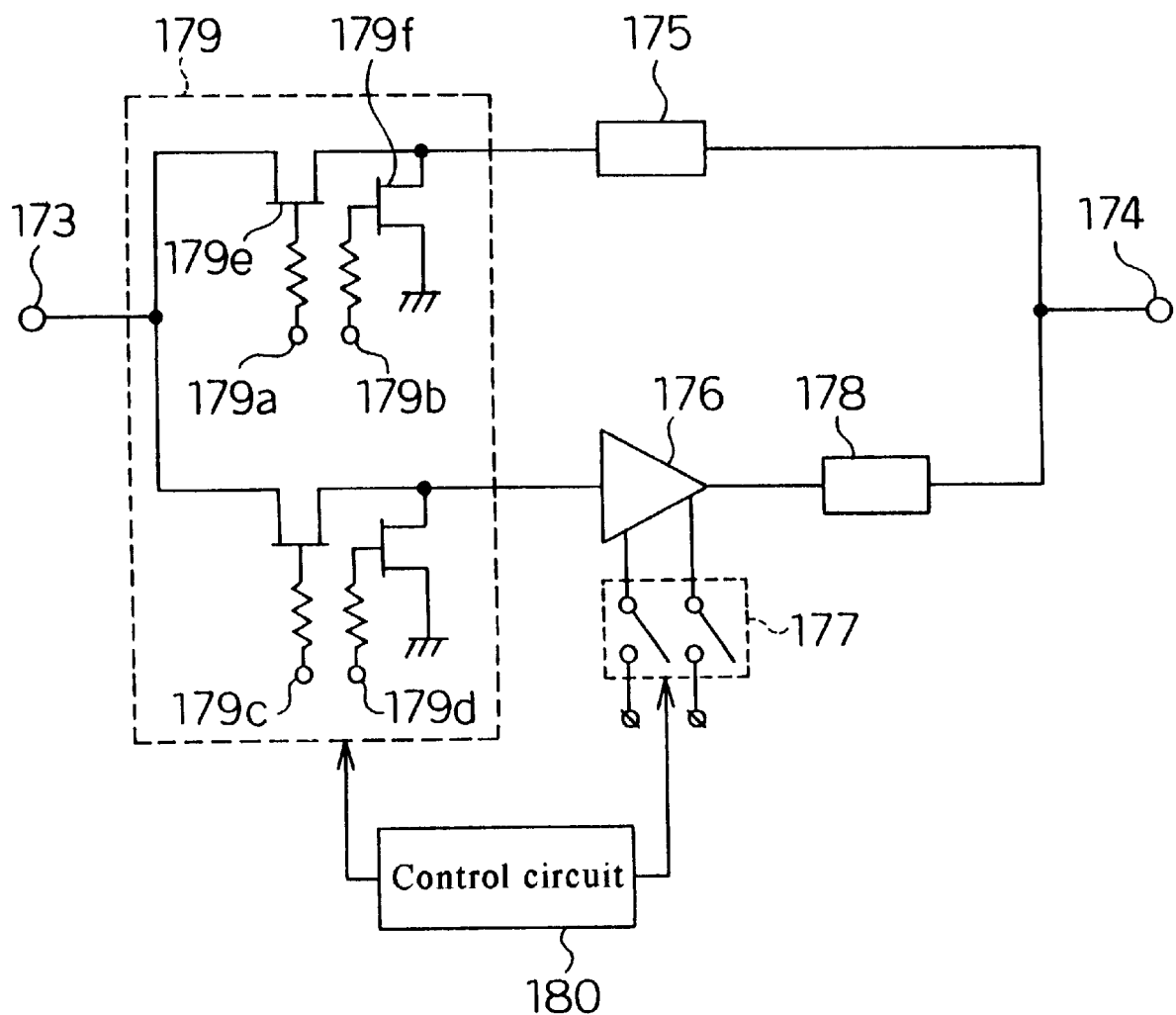
FIG. 17 is a block diagram showing a constitution of embodiment 9 of the invention.

FIG. 17 shows a high efficiency power amplifier in embodiment 9 of the invention. In FIG. 17, reference numeral 173 is an input terminal, 174 is an output terminal, 175 is a first strip line as first transmission line, 178 is a second strip line as second transmission line, 176 is a power amplifier, 177 is a first switch circuit as power source changeover means for turning on or off the bias of the power amplifier 176, 179 is a second switch circuit as input branching means, and 180 is a control circuit for controlling the first and second switch circuits 177, 179. This embodiment is similar to embodiment 7, excluding the output side switch circuit.

In thus constituted high efficiency power amplifier, the operation is described below while referring to the drawing.

When a high level potential (H) is applied to the terminal 179a, and a low level potential (L) to terminal 179b, a transistor 179e is turned on, a transistor 179f is turned off, and the first strip line 175 is connected to the input terminal 173. On the other hand, when L is applied to the terminal 179a and H to the terminal 179b, the transistor 179e is turned off and the transistor 179f is turned on, and therefore the first strip line 175 is cut off, and the impedance at the input end of the first strip line 175 is short-circuited.

Similarly, when H is applied to a terminal 179c and L to a terminal 179d, the power amplifier 176 is connected to the input terminal 173, and, to the contrary, when L is applied to the terminal 179c and H to the terminal 179d, the power amplifier 176 is cut off.

First, when the first strip line 175 only is connected, to reduce the loss due to leak of signal into the power amplifier 176 side, same as in embodiment 6, the length of the second strip line 178 is adjusted so that the impedance as seen from the output side of the second strip line 178 to the input side may be a high impedance. On the other hand, when only the power amplifier 176 is connected and is in active state, since the input end of the first strip line 175 is short-circuited, by adjusting the length of the first strip line 175 to a quarter wavelength of the operating frequency, the impedance as seen from the output side of the first strip line 175 to the input side becomes a high impedance.

By thus constituting, the same effect as in embodiment 7 is obtained. Moreover, since the output side switch circuit is omitted, the control circuit 180 is simplified from embodiment 7.

Figure 21:
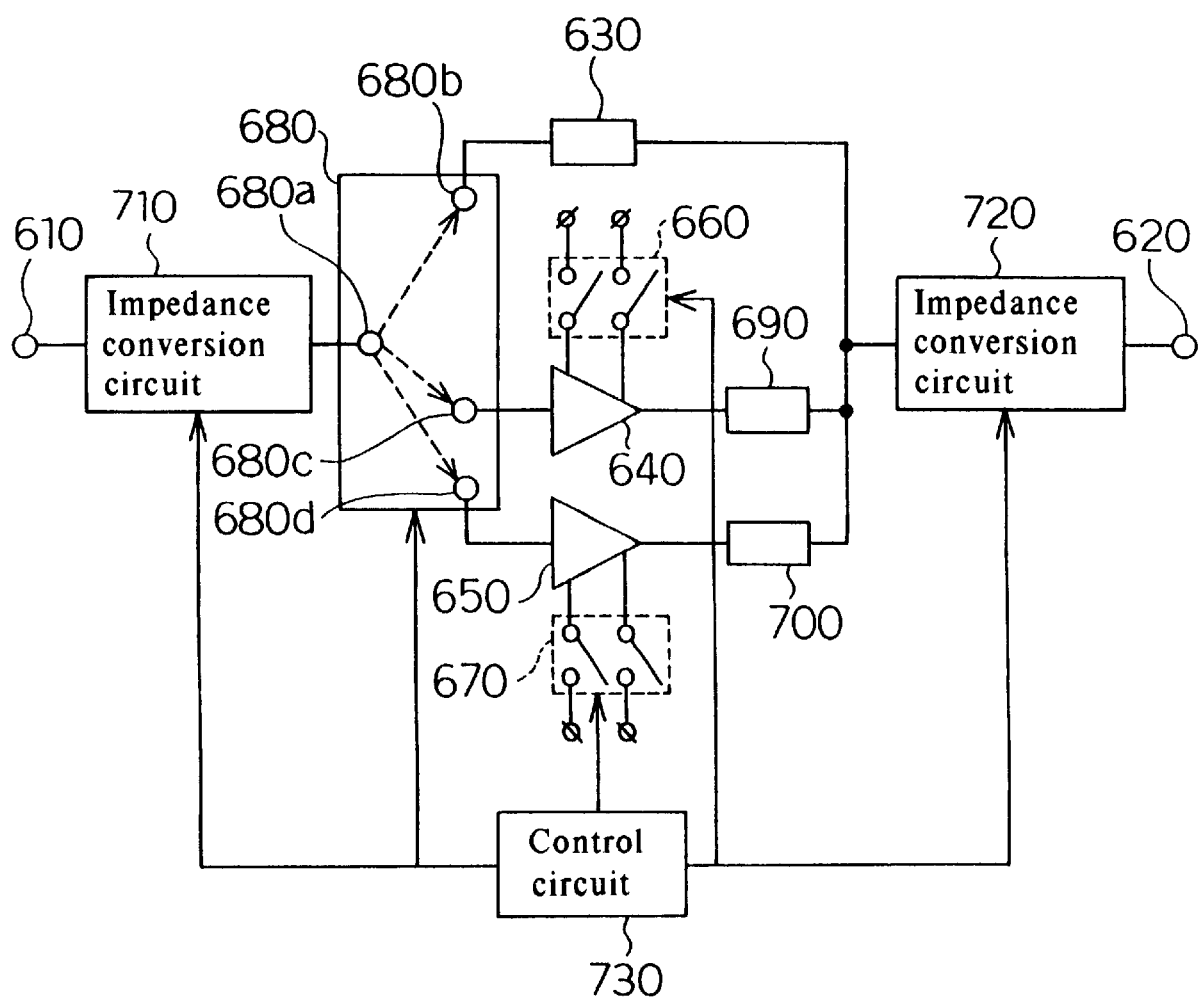
FIG. 21 is a block diagram showing other constitution of embodiment 9 of the invention.

This embodiment is applied to the circuit in embodiment 7, but a similar circuit construction may be also applied in embodiment 8. An example is given in FIG. 21. That is, a first switch circuit 680 as input branching means is connected to an input terminal 610 through a first impedance conversion circuit 710, and a first strip line 630 as first transmission line and first and second power amplifiers 640, 650 are connected to changeover terminals 680b, 680c, 680d of the first switch circuit 680, respectively. To the outputs of first and second power amplifiers 640, 650, second strip lines 690, 700 as second transmission lines are connected respectively, and the second strip lines 690, 700 and the first strip line 630 are connected commonly. Further, at the common junction of the strip lines, an output terminal 620 is connected through a second impedance circuit 720. A terminal 680a of the first switch circuit 680 is a common terminal.

There are also second and third switch circuits 660, 670 as power source changeover means for turning on or off the bias of the first and second power amplifiers 640, 650, and the second and third switch circuits 660, 670, first switch circuit 680, and first and second impedance conversion circuits 710, 720 are controlled by a control circuit 730. In this constitution, it allows to select whether or not to deliver the input signal without amplifying, or to deliver maximum output or lowered output in the state maintaining the maximum efficiency.

The strip line is explained herein, but the operation is the same by using other transmission line than the strip line.
(Embodiment 10)

Figure 18:
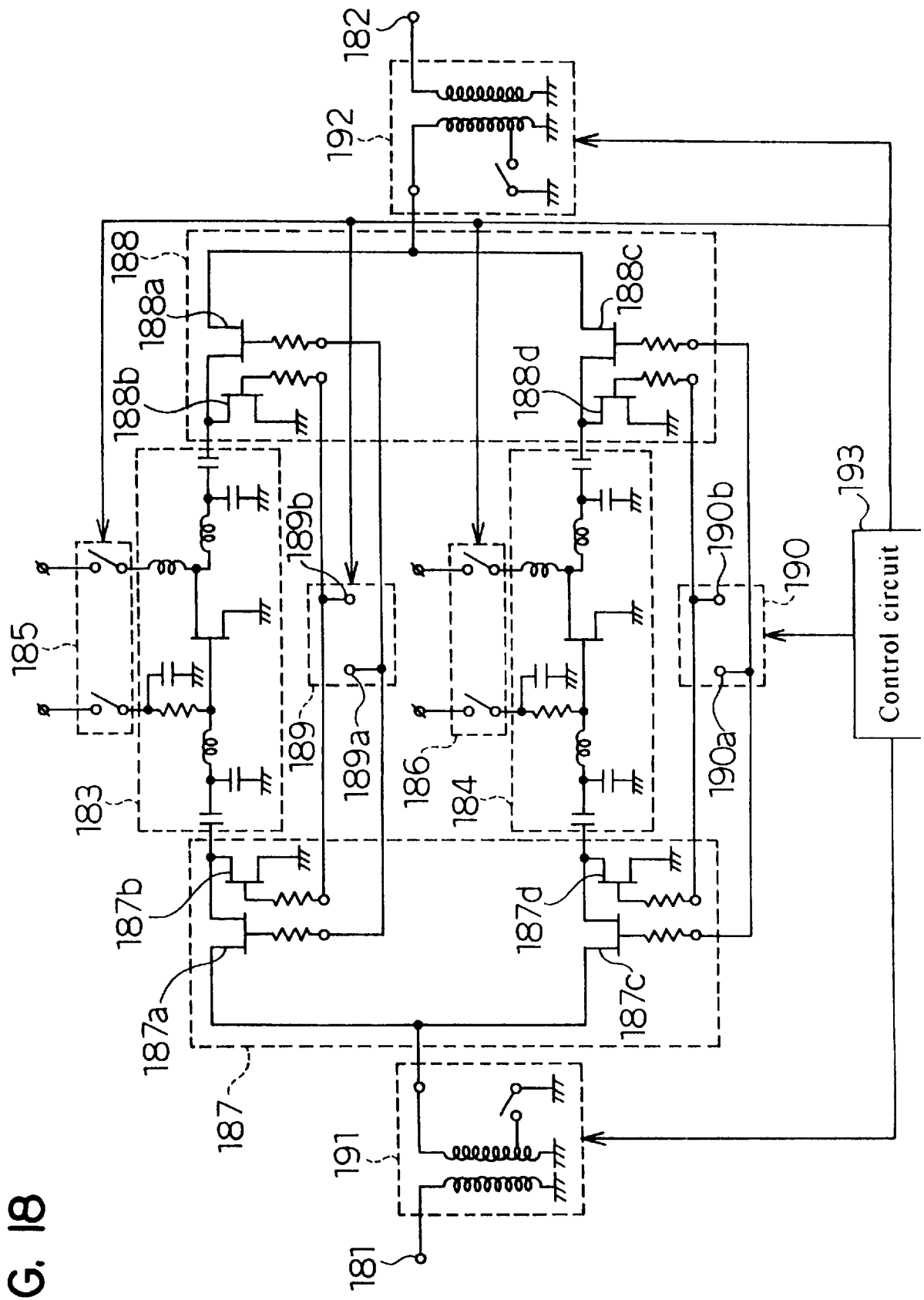
FIG. 18 is a block diagram showing a constitution of embodiment 10 of the invention.
Figure 19:
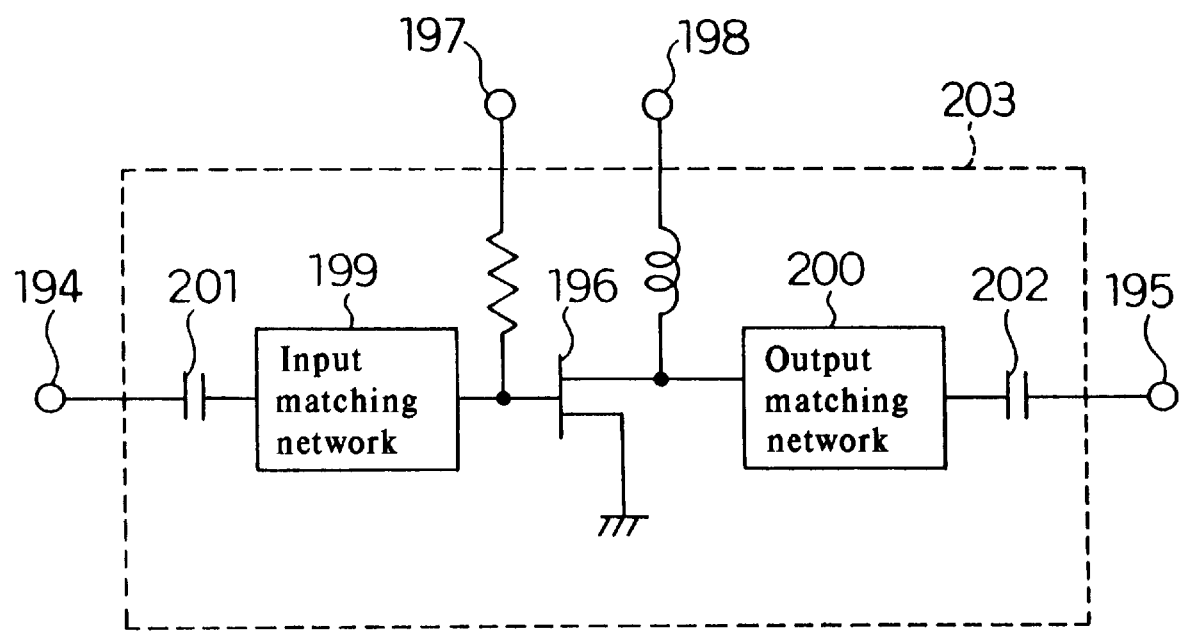
FIG. 19 is a diagram showing an example of constitution of a conventional power amplifier.
Figure 20:
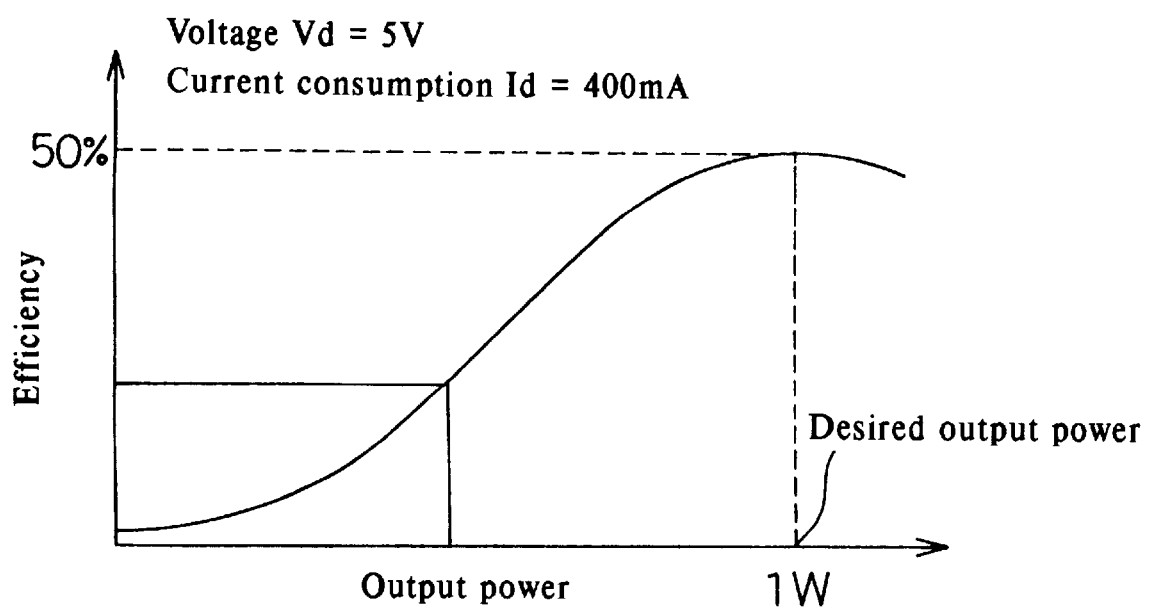
FIG. 20 is a diagram showing the relation of output power and efficiency in a conventional power amplifier.

FIG. 18 shows a high efficiency power amplifier in embodiment 10 of the invention. In FIG. 18, reference numeral 181 is an input terminal, 182 is an output terminal, 183, 184 are first and second power amplifiers, 185, 186 are first and second switch circuits for turning on or off the bias of the first and second power amplifiers 183, 184, 187 is a third switch circuit as input branching means, 188 is a fourth switch circuit as output selecting means, 189, 190 are bias units of the third and fourth switch circuits 187, 188, 191, 192 are first and second impedance conversion circuits, and 193 is a control circuit for controlling the first to fourth switch circuits 185 to 188, and first and second impedance conversion circuits 191, 192.

In thus constituted high efficiency power amplifier, the operation is described below while referring to the drawing.

Basically, the operation is same as in embodiment 4. When a high level potential (H) is applied to a terminal 189a, and a low level potential (L) to a terminal 189b, transistors 187a and 188a turned on, transistors 187b and 188b turned off, and the first power amplifier 183 is connected to the input terminal 181 and output terminal 182. On the other hand, when L is applied to the terminal 189a, and H to the terminal 189b, the transistors 187a and 188a turned off, the transistors 187b and 188b turned on, and the first power amplifier 183 is cut off.

Similarly, when H is applied to a terminal 190a and L to a terminal 190b, the second power amplifier 184 is connected to the input terminal 181 and output terminal 182, and, to the contrary, when L is applied to the terminal 190a and H to the terminal 190b, the second power amplifier 184 is cut off.

First, to maximize the output power, potential H is applied to the terminal 189a, L to 189b, H to 190a, and L to 190b, and the first and second switch circuits 185, 186 are turned on to apply bias, thereby setting the first and second power amplifiers 183, 184 in active state. To reduce the output power to half, of the maximum output power, potential H is applied to the terminal 189a, L to 189b, L to 190a, and H to 190b, and the first switch circuit 185 is turned on to set only the first power amplifier 183 in active state, or potential L is applied to the terminal 189a, H to 189b, H to 190a, and L to 190b, and the second switch circuit 186 is turned on to set only the second power amplifier 184 in active state.

In the first impedance conversion circuit 191, when connecting two power amplifiers, the switch provided at a position where the turn ratio is $1:2^{-1/2}$ (=1 : 0.707) is turned on, or when connected only one, by turning off the same switch, the impedance is converted. Similarly, in the second impedance conversion circuit 192, when connecting two power amplifiers, the switch provided at a position where the turn ratio is $2^{-1/2} : 1$ (=0.707:1) is turned on, or when connected only one, by turning off the same switch, the impedance is converted. By thus controlling, the same effect as in embodiment 4 is obtained.

The embodiment is applied in the circuit of embodiment 4, but a similar circuit construction may be also applied in embodiments 5 to 9.

Moreover, in the embodiment, the switch circuit as input branching means or output selecting means is composed of FET and resistance only, but the switch circuit is not limited to this construction, and, for example, it may be composed of at least one FET and a peripheral circuit comprising resistance, coil and capacitor. Or not limited to such constitution, various semiconductor switches may be used. This is also true in FIG. 17 and other embodiments.
(Embodiment 11)

Embodiment 11 may be applied, for example, in the high efficiency linear power amplifier of plural frequency bands shown in FIG. 1, in which a post-amplifying block for frequency band A composed of matching network 5, post-amplifier 6, and post-matching network 7, and a post-amplifying block for frequency band B composed of matching network 9, post-amplifier 10, and post-matching network 11 may be composed of any one of the high efficiency power amplifiers in embodiments 4 to 10. This is also same in FIG. 3, and such constitution is applicable to plural frequency bands, and further the maximum efficiency may be obtained if a lowed output power is used. Therefore, by using the power amplifier of the invention, it is effective to present a wireless appliance such as cellular telephone and PHS that is compact, high in efficiency, and applicable to plural frequency bands.

What is claimed is:

1. A high efficiency linear power amplifier of plural frequency bands comprising:
    pre-amplifying means connected to an input terminal for receiving signals in plural frequency bands, for amplifying the input signals of plural frequency bands,
    changeover means of plural frequency bands for changing over the output of the pre-amplifying means for issuing to any one of plural changeover terminals, and
    a plurality of post-amplifying blocks connected to each one of the plural changeover terminals of the changeover means of plural frequency bands,
    wherein each one of said plurality of post-amplifying blocks comprises single frequency band matching means for matching impedance between the output of the pre-amplifying means and input of a below-described post-amplifying means in a single frequency band, post-amplifying means for amplifying the output signal of the single frequency band matching means, post-matching means connected to the output of the post-amplifying means for matching the output impedance of the post-amplifying means in a single frequency band, and output terminal for issuing the output signal of the post-matching means.

2. A high efficiency linear power amplifier of plural frequency bands of claim 1, wherein the output of the pre-amplifying means is connected to the changeover means of plural frequency bands through auxiliary matching means, and the auxiliary matching means matches the impedance of the inputs of the pre-amplifying means and post-amplifying means in the operating frequency band through cooperation with the element of the single frequency band matching means in each frequency band.

3. A high efficiency linear power amplifier of plural frequency bands of claim 1 wherein wide band matching means for matching the impedance between the output of the pre-stage and the input of the pre-amplifying means in plural frequency bands is provided between the input terminal and the pre-amplifying means.

4. A high efficiency linear power amplifier of plural frequency bands of claim 2, wherein the auxiliary matching means is a grounded capacitance or low impedance line, and the single frequency band matching means is an inductance.

5. A high efficiency linear power amplifier of plural frequency bands of claim 3, wherein the wide band matching means is a combination of a set of inductance and capacitance and a negative feedback amplifier.

6. A high efficiency linear power amplifier of plural frequency bands of claim 1, wherein at least whole constituent elements are composed on a same semiconductor chip.

7. A high efficiency linear power amplifier of plural frequency bands of claim 1, wherein at least the pre-amplifying means, changeover means of plural frequency bands, plurality of single frequency band matching means, and plurality of post-amplifying means are composed on a same semiconductor chip.

8. A high efficiency linear power amplifier of plural frequency bands of claim 2, wherein at least the pre-amplifying means, auxiliary matching means, changeover means of plural frequency bands, plurality of single frequency band matching means, and plurality of post-amplifying means are composed on a same semiconductor chip.

9. A high efficiency linear power amplifier of plural frequency bands of claim 3, wherein at least the wide band matching means, pre-amplifying means, changeover means of plural frequency bands, plurality of single frequency band matching means, and plurality of post-amplifying means are composed on a same semiconductor chip.

10. A high efficiency linear power amplifier of plural frequency bands of claim 3, wherein at least the wide band matching means, pre-amplifying means, auxiliary matching means, changeover means of plural frequency bands, plurality of single frequency band matching means, and plurality of post-amplifying means are composed on a same semiconductor chip.

11. A high efficiency linear power amplifier of plural frequency bands of claim 1, wherein at least the pre-amplifying means and changeover means of plural frequency bands are composed on a same semiconductor chip.

12. A high efficiency linear power amplifier of plural frequency bands of claim 2, wherein at least the pre-amplifying means, auxiliary matching means, and changeover means of plural frequency bands are composed on a same semiconductor chip.

13. A high efficiency linear power amplifier of plural frequency bands of claim 3, wherein at least the wide band matching means, pre-amplifying means, and changeover means of plural frequency bands are composed on a same semiconductor chip.

14. A high efficiency linear power amplifier of plural frequency bands of claim 3, wherein at least the wide band matching means, pre-amplifying means, auxiliary matching means, and changeover means of plural frequency bands are composed on a same semiconductor chip.

15. A high efficiency power amplifier comprising at least two power amplifiers, at least two power source changeover means for turning on or off the power source of each one of the power amplifiers, a first common terminal, input branching means having a switching function between the input terminals of each one of the power amplifiers from the first common terminal, first impedance converting means for converting the impedance of the first common terminal, a second common terminal, output selecting means having a switching function between the output terminals of each one of the power amplifiers from the second common terminal, second impedance converting means for converting the impedance of the second common terminal, and control means for controlling the input branching means and output selecting means depending on a required output power to connect a necessary number of the power amplifiers, converting the input impedance of the first common terminal by the first impedance converting means depending on the connection state of the power amplifiers, converting the impedance of the second common terminal by the second impedance converting means depending on the connection state of the power amplifiers, turning on those power source changeover means corresponding to the connected power amplifiers, and turning off the others.

16. A high efficiency power amplifier comprising at least two power amplifiers, each transmission line having one end connected in series to the output terminal of each one of the power amplifiers, and other end connected commonly, at least two power source changeover means for turning on or off the power source of each one of the power amplifiers, a common terminal, input branching means having a switching function between the input terminals of each one of the power amplifiers from the common terminal, first impedance converting means for converting the impedance of the common terminal, second impedance converting means for converting the impedance, being connected to the common junction of the transmission line, and control means for controlling the input branching means depending on a required output power to connect a necessary number of the power amplifiers, converting the input impedance of the common terminal by the first impedance converting means depending on the connection state of the power amplifiers, converting the impedance by the second impedance converting means depending on the connection state of the power amplifiers, turning on those power source changeover means corresponding to the connected power amplifiers, and turning off the others, wherein the impedance as seen from the output side of each transmission line to the input side when the power source changeover means of each one of the power amplifiers is turned off is set so as to be a high impedance.

17. A high efficiency power amplifier comprising at least two power amplifiers, a transmission line, at least two power source changeover means for turning on or off the power source of each one of the power amplifiers, a first common terminal, input branching means having a switching function between the input terminal of each one of the power amplifiers and the input terminal of the transmission line from the first common terminal, first impedance converting means for converting the impedance of the first common terminal, a second common terminal, output selecting means having a switching function between the output terminal of each one of the power amplifiers and the output terminal of the transmission line from the second common terminal, second impedance converting means for converting the impedance of the second common terminal, and control means for controlling the input branching means and output selecting means depending on a required output power to connect a necessary number of the power amplifiers, converting the input impedance of the first common terminal by the first impedance converting means depending on the connection state of the power amplifiers, converting the impedance of the second common terminal by the second impedance converting means depending on the connection state of the power amplifiers, turning on those power source changeover means corresponding to the connected power amplifiers, and turning off the others, or when not necessary to amplify, controlling the input branching means and output selecting means to connect the transmission line, and turning off all of the power source changeover means of the power amplifiers.

18. A high efficiency power amplifier comprising a power amplifier, a first transmission line, a second transmission line having one end connected in series to the output terminal of the power amplifier, and other end connected commonly with the output end of the first transmission line, power source changeover means for turning on or off the bias of the power amplifier, a common terminal, input branching means for changing over the input terminal of the power amplifier and the input terminal of the first transmission line from the common terminal, and control means for controlling the input branching means to connect the power amplifier, and turning on the power source changeover means, at the time of high output, or controlling the input branching means to connect the first transmission line, and turning off the power source changeover means, at the time of low output, wherein the impedance as seen from the output side of second transmission line to the input side when the power source changeover means of the power amplifier is turned off is set so as to be a high impedance, and the impedance as seen from the output side of the first transmission line to the input side when the first transmission line is cut off is set to be a high impedance.

19. A high efficiency power amplifier comprising at least two power amplifiers, a first transmission line, each second transmission line having one end connected in series to the output terminal of each one of the power amplifiers and other end connected commonly to the output end of the first transmission line, at least two power source changeover means for turning on or off the power source of each one of the power amplifiers, a common terminal, input branching means having a switching function between the input terminal of each one of the power amplifiers and the input terminal of the first transmission line from the common terminal, a first impedance converting means for converting the impedance of the common terminal, second impedance converting means for converting the impedance, being connected at the common junction of the first and second transmission lines, and control means for controlling the input branching means depending on a required output power to connect a necessary number of the power amplifiers, converting the input impedance of the common terminal by the first impedance converting means depending on the connection state of the power amplifiers, converting the impedance by the second impedance converting means depending on the connection state of the power amplifiers, turning on those power source changeover means corresponding to the connected power amplifiers, and turning off the others, or when not necessary to amplify, controlling the input branching means to connect the first transmission line, and turning off all of the power source changeover means of the power amplifiers, wherein the impedance as seen from the output side of each second transmission line to the input side when the power source changeover means of each one of the power amplifiers is turned off is set so as to be a high impedance, and the impedance as seen from the output side of the first transmission line to the input side when the first transmission line is cut off is set to be a high impedance.

20. A high efficiency power amplifier of claim 15, wherein at least one of the power amplifiers is a power amplifier having a different output power.

21. A wireless appliance comprising the high efficiency linear power amplifier of plural frequency bands of claim 1.

22. A high efficiency power amplifier comprising at least two power amplifiers,
at least two power source changeover means for turning on or off the power source of each one of the power amplifiers,
a first common terminal,
input branching means having a switching function between the input terminals of each one of the power amplifiers from the first common terminal,
first impedance converting means for converting the impedance of the first common terminal,
a second common terminal,
output selecting means having a switching function between the output terminals of each one of the power amplifiers from the second common terminal,
second impedance converting means for converting the impedance of the second common terminal, and
control means for controlling the input branching means and output selecting means depending on a required output power to connect a necessary number of the power amplifiers, converting the input impedance of the first common terminal by the first impedance converting means depending on the connection state of the power amplifiers, converting the impedance of the second common terminal by the second impedance converting means depending on the connection state of the power amplifiers, turning on those power source changeover means corresponding to the connected power amplifiers, and turning off the others,
wherein the first and second impedance converting means each has a transformer for changing the turn ratio.

23. A high efficiency linear power amplifier of plural frequency bands of claim 1, wherein said post amplifying means includes at least two power amplifiers, at least two power source changeover means for turning on or off the power source of each one of the power amplifiers, a first common terminal, input branching means having a switching function between the input terminals of each one of the power amplifiers from the first common terminal, first impedance converting means for converting the impedance of the first common terminal, a second common terminal, output selecting means having a switching function between the output terminals of each one of the power amplifiers from the second common terminal, second impedance converting means for converting the impedance of the second common terminal, and control means for controlling the input branching means and output selecting means depending on a required output power to connect a necessary number of the power amplifiers, converting the input impedance of the first common terminal by the first impedance converting means depending on the connection state of the power amplifiers, converting the impedance of the second common terminal by the second impedance converting means depending on the connection state of the power amplifiers, turning on those power source changeover means corresponding to the connected power amplifiers, and turning off the others.

* * * * *